(12) United States Patent
Lowrey

(10) Patent No.: US 7,969,769 B2
(45) Date of Patent: Jun. 28, 2011

(54) MULTI-TERMINAL CHALCOGENIDE LOGIC CIRCUITS

(75) Inventor: Tyler Lowrey, West Augusta, VA (US)

(73) Assignee: Ovonyx, Inc., Troy, MI (US)

( * ) Notice: Subject to any disclaimer, the term of this patent is extended or adjusted under 35 U.S.C. 154(b) by 1077 days.

(21) Appl. No.: 11/724,485

(22) Filed: Mar. 15, 2007

(65) Prior Publication Data
US 2008/0224734 A1 Sep. 18, 2008

(51) Int. Cl.
*G11C 11/00* (2006.01)
(52) U.S. Cl. ......... 365/163; 365/148; 326/52; 326/104
(58) Field of Classification Search ............ 326/37, 326/38, 104, 112, 52; 365/148, 163
See application file for complete search history.

(56) References Cited

U.S. PATENT DOCUMENTS

| | | | | |
|---|---|---|---|---|
| 5,166,758 A * | 11/1992 | Ovshinsky et al. | ............ | 257/3 |
| 5,296,716 A * | 3/1994 | Ovshinsky et al. | ............ | 257/3 |
| 5,534,711 A * | 7/1996 | Ovshinsky et al. | ............ | 257/3 |
| 5,536,947 A * | 7/1996 | Klersy et al. | ............ | 257/3 |
| 5,543,737 A * | 8/1996 | Ovshinsky | ............ | 326/104 |
| 5,596,522 A * | 1/1997 | Ovshinsky et al. | ............ | 365/113 |
| 5,694,054 A * | 12/1997 | Ovshinsky et al. | ............ | 326/35 |
| 5,694,146 A * | 12/1997 | Ovshinsky et al. | ............ | 345/91 |
| 5,714,768 A * | 2/1998 | Ovshinsky et al. | ............ | 257/40 |
| 5,757,446 A * | 5/1998 | Ovshinsky et al. | ............ | 349/49 |
| 6,087,674 A * | 7/2000 | Ovshinsky et al. | ............ | 257/2 |
| 6,671,710 B2 * | 12/2003 | Ovshinsky et al. | ............ | 708/493 |
| 6,714,954 B2 * | 3/2004 | Ovshinsky et al. | ............ | 708/200 |
| 6,963,893 B2 * | 11/2005 | Ovshinsky et al. | ............ | 708/491 |
| 6,967,344 B2 * | 11/2005 | Ovshinsky et al. | ............ | 257/4 |
| 6,969,867 B2 * | 11/2005 | Ovshinsky | ............ | 257/4 |
| 6,999,953 B2 * | 2/2006 | Ovhsinsky | ............ | 706/39 |
| 7,186,998 B2 * | 3/2007 | Ovshinsky et al. | ............ | 257/3 |
| 2007/0096071 A1 * | 5/2007 | Kordus et al. | ............ | 257/2 |
| 2007/0267623 A1 * | 11/2007 | Ovshinsky | ............ | 257/9 |

OTHER PUBLICATIONS

Ovshinsky, "Reversible Electrical Switching Phenomena in Disordered Structures," Nov. 11, 1968. Physical Review Letters, vol. 21, No. 20, pp. 1450-1455.*
Ovshinsky et al., "Amorphous Semiconductors for Switching, Memory, and Imaging Applications," Feb. 1993. IEEE Transactions on Electron Devices, Col. ED-20, No. 2, pp. 91-105.*

* cited by examiner

*Primary Examiner* — Alexander Sofocleous
(74) *Attorney, Agent, or Firm* — Kevin L. Bray

(57) ABSTRACT

Logic circuits are disclosed that include one or more three-terminal chalcogenide devices. The three-terminal chalcogenide devices are electrically interconnected and configured to perform one or more logic operations, including AND, OR, NOT, NAND, NOR, XOR, and XNOR. Embodiments include series and parallel configurations of three-terminal chalcogenide devices. The chalcogenide devices include a chalcogenide switching material as the working medium along with three electrical terminals in electrical communication therewith.

In one embodiment, the circuits include one or more input terminals, one or more output terminals, and a clock terminal. The input terminals receive one or more input signals and deliver them to the circuit for processing according to a logic operation. Upon conclusion of processing, the output of the circuit is provided to the output terminal. The clock terminal delivers a clock signal to facilitate operation of the three-terminal devices included in the instant circuits. In one embodiment, the clock signal includes an ON cycle and an OFF cycle, where the circuit performs a logic operation during the ON cycle and any three-terminal devices that are switched to the conductive state during the ON cycle are returned to their resistive state during the OFF cycle.

38 Claims, 7 Drawing Sheets

FIG − 3

MULTI-TERMINAL CHALCOGENIDE LOGIC CIRCUITS

FIELD OF INVENTION

This invention pertains to chalcogenide electronic devices and circuits. More particularly, this invention relates to chalcogenide logic devices and circuits useful in the processing of information. Most particularly, this invention relates to multi-terminal chalcogenide switching devices that can be configured to provide logic functionality.

BACKGROUND OF THE INVENTION

The desire to expand the frontiers of computer science has prompted consideration of the factors that contribute to the limitations of current computers. Silicon is at the heart of today's computer. The advances in computing power and speed over the years have largely been a consequence of better understanding the fundamental properties of silicon and harnessing those properties for practical effect. Initial progress was predicated on building basic electronic components such as transistors and diodes out of silicon and later progress followed from the development of integrated circuits. More recent advances represent a continuation of these trends and currently emphasize miniaturization and the integration of an ever larger number of microelectronic devices on a single chip. Smaller devices lead to higher memory storage densities, more highly integrated circuits and reduced interaction times between devices on the same chip.

Since future improvements in computing power and functionality are currently predicated on further improvements in silicon technology, there has been much recent discussion about the prognosis for continued miniaturization of silicon-based electronic devices. A growing consensus is emerging that believes that the computer industry is rapidly approaching the performance limits of silicon. The feature size in today's manufacturing technologies is approximately 0.10 micron and it is expected that this can be reduced to about 0.02 micron in the future. Further decreases in feature size, however, are deemed problematic because sizes below about 0.02 micron lead to a change in the fundamental behavior of silicon. More specifically, as the dimensions of silicon devices decrease to tens of nanometers and below, silicon enters the quantum regime of behavior and no longer functions according to the classical physics that governs macroscopic objects. In the quantum regime, phenomena such as tunneling lead to delocalization of electrons across many devices. Consequences of tunneling include leakage current as electrons escape from one device to neighboring devices and a loss of independence of devices as the state of one device influences the state of neighboring devices. In addition to fundamental changes in the behavior of silicon, further decreases in the dimensions of silicon devices also pose formidable technological challenges. New and costly innovations in fabrication methods such as photolithography will be needed to achieve smaller feature sizes.

One strategy for advancing the capabilities of computers is to identify materials other than silicon that can be used as the active medium in data processing and/or storage applications. Such alternative computing media could be used independent of or in combination with silicon to form the basis of a new computing industry that seeks to offer better performance and more convenient manufacturing than is possible with silicon.

Chalcogenide materials are an emerging class of alternative materials for the storage and processing of information. Chalcogenide materials have been previously utilized in optical and electrical memory and switching applications and some representative compositions and properties have been discussed in U.S. Pat. Nos. 5,543,737; 5,694,146; 5,757,446; 5,166,758; 5,296,716; 5,534,711; 5,536,947; 5,596,522; and 6.087,674; the disclosures of which are hereby incorporated by reference herein, as well as in several journal articles including "Reversible Electrical Switching Phenomena in Disordered Structures", Physical Review Letters, vol. 21, p. 1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference herein.

Chalcogenide phase-change materials form the basis of OUM (Ovonic Universal Memory) technology. OUM is a non-volatile form of memory that is viewed in the near term as a viable alternative to flash memory and DRAM and in the longer term as a viable alternative to SRAM. The functional characteristic of chalcogenide phase-change materials that underlies memory operation is the ability of phase-change materials to undergo a reversible transformation between two or more structural states. The chalcogenide phase-change materials have structural states that include a crystalline state, one or more partially crystalline states and an amorphous state. The crystalline state may be a single crystalline state or a polycrystalline state. A partially crystalline state is a structural state of a phase-change material that includes an amorphous portion and a crystalline portion. Chalcogenide phase-change materials include a plurality of partially crystalline states that differ in the relative proportion of the amorphous and crystalline portions included within a volume of the material. The various structural states of a phase-change material may be distinguished on the basis of electrical resistance. Memory functionality can be achieved by associating different memory states with different structural states and using electrical resistance as the means to read the memory device and discriminate among the different memory states. In a binary memory device having memory states "0" and "1", for example, state "0" may be associated with a substantially crystalline state and the state "1" may be associated with a substantially amorphous state. Since the resistance of a substantially crystalline state is at least an order of magnitude lower than the resistance of a substantially amorphous state, the two states are readily distinguished through a simple resistance measurement. The operation of storing information (writing or programming) occurs by providing energy (most commonly in the form of electrical current pulses) to the phase-change material to induce the structural transformations needed to establish the desired proportions of crystalline and amorphous phase domains within a volume of the phase-change material. Controlled applications of energy can be used to reversibly and continuously vary the relative proportions of crystalline and amorphous phase domains to establish the structural state corresponding to the information that the programmer wishes to store. Once established, a memory state is stable until further energy having a magnitude sufficient to reprogram the material is applied. The current used to determine the resistance of the device (and thus to read the device) is too low to alter the structural state of the phase-change material.

Chalcogenide switching materials form the basis of the Ovonic Threshold Switch (OTS) technology. Chalcogenide switching materials are substantially amorphous materials that exhibit little or no tendency to undergo a structural transformation to a crystalline or partially crystalline state, but which instead undergo rapid switching from a resistive state to a conductive state upon application of a threshold voltage, $V_{th}$. According to a leading model of the switching event, application of the threshold voltage causes the formation of a conductive channel or filament within the chalcogenide material. At the threshold voltage, the electric field experienced by the material is sufficiently, high to induce a breakdown or avalanche-like effect whereby electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide material. The conductive filament extends through the chalcogenide material between the device terminals and provides a low resistance pathway for electrical current. Creation of a conductive state upon switching enables the device to support high currents.

In order to advance a new chalcogenide-based computing paradigm, it is necessary to develop devices and circuits for performing data storage and processing operations. Chalcogenide OUM technology provides a versatile and robust memory platform for storing data. Representative examples of the application of chalcogenide phase change materials to data processing include mathematical operations (U.S. Pat. No. 6,671,710 ("Methods of Computing with Digital Multistate Phase Change Materials")) factoring algorithms (U.S. Pat. No. 6,714,954 ("Methods of Factoring and Modular Arithmetic"), modular arithmetic (U.S. Pat. No. 6,963,893 ("Methods of Factoring and Modular Arithmetic")), and neural network processing (U.S. Pat. No. 6,999,953 ("Analog Neurons and Neurosynaptic Networks"). Applications of chalcogenide switching materials to data processing include U.S. Pat. No. 5,543,737 ("Logical Operation Circuit Employing Two-Terminal Chalcogenide Switches").

Recent work in the area of chalcogenide switching devices has demonstrated the operability of a three-terminal chalcogenide switching device. In these devices, a third terminal is added to the standard two-terminal chalcogenide switching device to enable control over the operating characteristics of the device. Application of a voltage signal or electric field to the third terminal, for example, provides a mechanism for controlling the magnitude of the threshold voltage needed to effect the switching transition between the other two terminals of the device. (U.S. Pat. Nos. 6,967,344 ("Multi-Terminal Chalcogenide Switching Devices") and 6,969,867 ("Field Effect Chalcogenide Devices", the disclosures of which are incorporated by reference herein).

With the advent of new chalcogenide devices having increased functionality, it is desirable to consider their potential to further expand the capabilities of chalcogenide-materials in the realm of computation. In particular, it is desirable to consider the suitability of three-terminal chalcogenide devices for applications in data storage or data processing and to devise device structures and circuits that exploit the capabilities of three-terminal devices. In U.S. Pat. Nos. 6,967,344 ('344 patent) and 6,969,867 ('867 patent), the disclosures of which are hereby incorporated by reference herein, Ovshinsky et al. further develop the notion of phase change computing by presenting additional computing and storage devices. The '344 patent discusses a multi-terminal phase change device where a control signal provided at one electrical terminal modulates the current, threshold voltage or signal transmitted between other electrical terminals through the injection of charge carriers. The '867 patent describes a related multi-terminal device that utilizes a field effect terminal to modulate the current, threshold voltage or signal transmitted between other terminals. The devices described in the '344 and '867 patents may be configured to provide a functionality related to that of a transistor.

In addition to new storage and processing devices, progress in the field of chalcogenide electronics would further benefit from the introduction of logic circuits based on chalcogenide materials that are capable of performing one or more logic functions. In particular, it is desirable to develop logic circuits based on chalcogenide memory and/or switching devices. The utilization of two-terminal chalcogenide switching devices in logic circuits has been discussed in U.S. Pat. Nos. 5,543,737 ('737 patent) and 5,694,054 ('054 patent); the disclosures of which are incorporated by reference herein. The potential for chalcogenide electronics further expand through the development of logic circuits that utilize the beneficial properties of the three-terminal family of chalcogenide devices.

SUMMARY OF THE INVENTION

The instant invention provides logic circuits that include three-terminal chalcogenide devices. The circuits include a three-terminal chalcogenide device or a combination of two or more three-terminal chalcogenide switching devices that are electrically interconnected and configured to perform one or more logic operations. Logic operations within the capability of the circuits of the instant invention include AND, OR, NOT, NAND, NOR, XOR, and XNOR.

The chalcogenide devices included within the instant circuits include a chalcogenide switching material as the working medium along with three electrical terminals in electrical communication therewith. The chalcogenide switching material is capable of transforming from a resistive state to a conductive state when a voltage having a sufficient magnitude is applied between two terminals of the device. Inclusion of the third terminal allows for manipulation of the magnitude of the voltage needed to induce the switching transformation.

In a preferred embodiment, the circuits include one or more input terminals, one or more output terminals, and a clock terminal. The input terminals receive one or more input signals and deliver them to the circuit for processing according to a logic operation. Upon conclusion of processing, the output of the circuit is provided to the output terminal. The clock terminal delivers a clock signal to facilitate operation of the three-terminal devices included in the instant circuits. In a preferred embodiment, the clock signal includes an ON cycle and an OFF cycle, where the circuit performs a logic operation during the ON cycle and any three-terminal devices that are switched to the conductive state during the ON cycle are returned to their resistive state during the OFF cycle. The input and output signals may be high and/or low signals and may alternatively be characterized as binary "1" and/or "0" states.

In one embodiment, the instant logic circuit functions as an inverter or NOT circuit. In this embodiment, the circuit includes a pair of three-terminal chalcogenide switching devices arranged in a series configuration. If the circuit receives a low input signal, it produces a high output signal. If the circuit receives a high input signal, it produces a low output signal.

In another embodiment, the instant logic circuit functions as a NAND gate. In this embodiment, a parallel combination of three-terminal chalcogenide devices is connected between the clock terminal and an output junction and a series combination of three-terminal chalcogenide devices is connected between the output junction and ground. The circuit includes two input terminals and an output terminal, where the values of the input signals produce a signal at the output junction according to the NAND logic operation. The signal appearing at the output junction is provided as an output signal to the output terminal.

In another embodiment, the instant logic circuit functions as a NOR gate. In this embodiment, a series combination of three-terminal chalcogenide devices is connected between the clock terminal and an output junction and a parallel combination of three-terminal chalcogenide devices is connected between the output junction and ground. The circuit includes two input terminals and an output terminal, where the values of the input signals produce a signal at the output junction according to the NOR logic operation. The signal appearing at the output junction is provided as an output signal to the output terminal.

In another embodiment, an AND gate is provided with a circuit that includes a series combination of a NAND circuit and a NOT circuit. In this embodiment, the NAND circuit includes two inputs and provides an output according to the NAND logic operation and this output is provided as the input of a NOT circuit to produce an output signal that corresponds to the logic operation AND as performed on the two inputs provided to the NAND circuit.

In another embodiment, an, OR gate is provided with a circuit that includes a series combination of a NOR circuit and a NOT circuit. In this embodiment, the NOR circuit includes two inputs and provides an output according to the NOR logic operation and this output is provided as the input of a NOT circuit to produce an output signal that corresponds to the logic operation OR as performed on the two inputs provided to the NOR circuit.

Further embodiments recognize that circuits that perform the logic operations XOR and XNOR can be obtained from combinations of one or more of NAND, NOT, NOR, AND, and OR.

The instant invention further provides a circuit that includes two or more operatively connected three-terminal chalcogenide switching devices. In one embodiment, the circuit includes two or more three-terminal chalcogenide switching devices connected in a series configuration. In another embodiment, the circuit includes two or more three-terminal switching devices connected in a parallel configuration.

For a better understanding of the instant invention, together with other and further objects thereof, reference is made to the following description, taken in conjunction with the accompanying drawings and claims.

DETAILED DESCRIPTION OF THE ILLUSTRATED EMBODIMENTS

The instant invention provides generally for logic elements or circuits in a chalcogenide computing technology. The instant logic circuits include a chalcogenide switching devices that contain a chalcogenide switching material along with three or more electrical terminals in electrical communication therewith. The operational characteristics of multi-terminal chalcogenide switching devices have been discussed in U.S. Pat. Nos. 6,967,344 ('344 patent) and 6,969,867 ('867 patent), the disclosures of which are incorporated by reference herein. The basic features of three-terminal chalcogenide switching devices are briefly described herein to better facilitate an understanding of the instant logic circuits.

Figure 1:
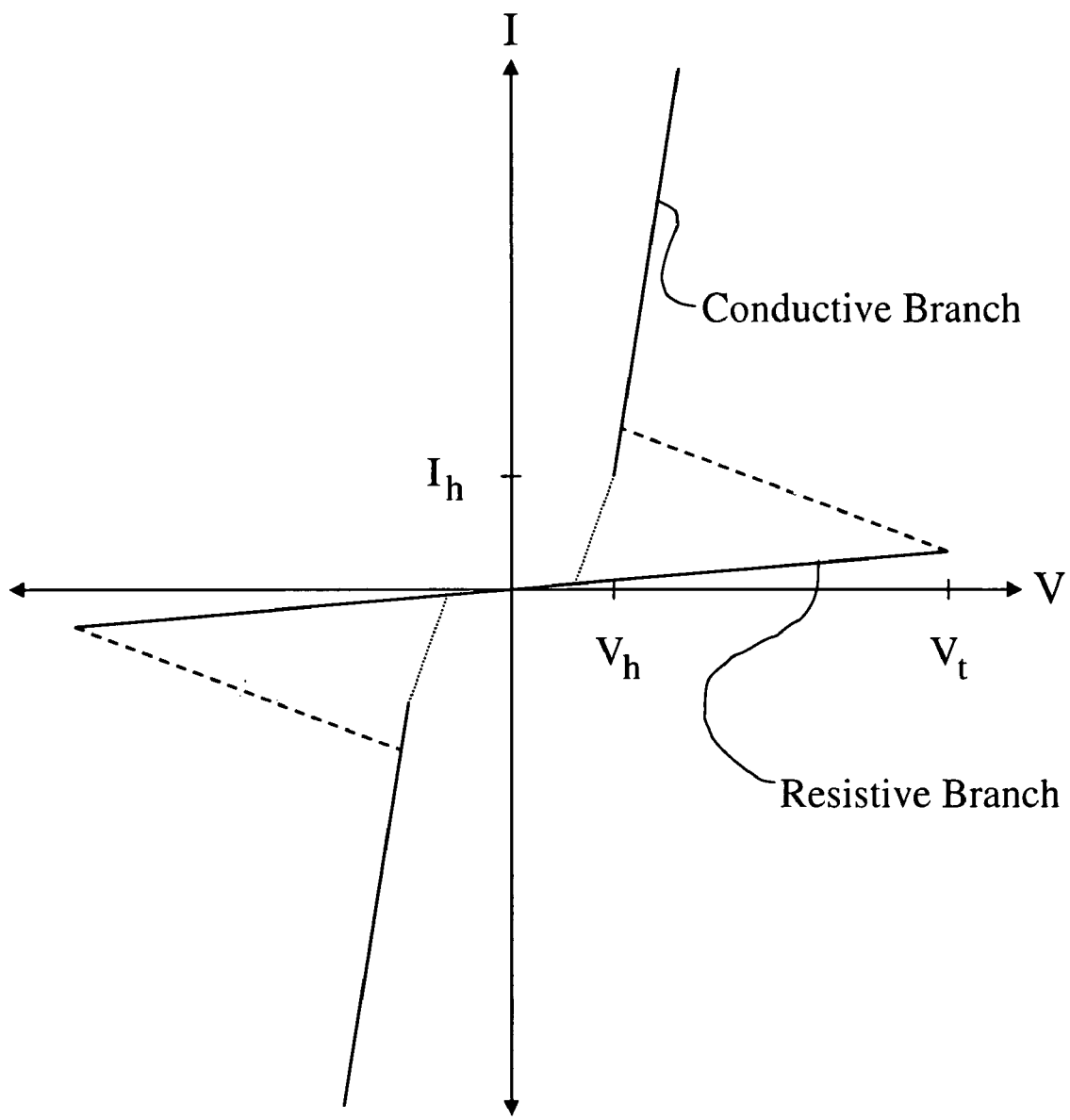
FIG. 1. I-V characteristics of a chalcogenide material exhibiting a switching transformation.

The electrical switching properties of the chalcogenide switching materials used in the instant devices are schematically illustrated in FIG. 1, which shows the I-V (current-voltage) characteristics of a chalcogenide switching material. The illustrative device of FIG. 1 corresponds to a two-terminal device configuration in which two spacedly disposed electrodes are in contact with a chalcogenide material and the current I corresponds to the current passing between the two electrodes. The I-V curve of FIG. 1 shows the current passing through the chalcogenide material as a function of the voltage applied across the material by the electrodes. The I-V characteristics of the material are symmetric with respect to the polarity of the applied voltage.

For convenience, we consider the first quadrant of the I-V plot of FIG. 1 (the portion in which current and voltage are both positive) in the brief discussion of chalcogenide switching behavior that follows. An analogous description that accounts for polarity applies to the third quadrant of the I-V plot.

The I-V curve includes a resistive branch and a conductive branch. The branches are labeled in FIG. 1. The resistive branch corresponds to the branch in which the current passing through the material increases only slightly upon increasing the voltage applied across the material. This branch exhibits a small slope in the I-V plot and appears as a nearly horizontal line in the first and third quadrants of FIG. 1. The conductive branch corresponds to the branch in which the current passing through the material increases significantly upon increasing the voltage applied across the material. This branch exhibits a large slope in the I-V plot and appears as a nearly vertical line in the first and third quadrants of FIG. 1. The slopes of the resistive and conductive branches shown in FIG. 1 are illustrative and not intended to be limiting, the actual slopes will depend on the chemical composition of the chalcogenide material and factors such as load resistances in the external circuitry. Regardless of the actual slopes, the conductive branch exhibits a larger slope than the resistive branch and signifies a more freely conducting state of the chalcogenide material than the resistive branch. When device conditions are such that the chalcogenide material is described by a point on the resistive branch of the I-V curve, the chalcogenide material or device may be said to be in a resistive state. When device conditions are such that the chalcogenide material is described by a point on the conductive branch of the IV curve, the chalcogenide material or device may be said to be in a conductive state.

The switching properties of the chalcogenide material used in the switching embodiments of the instant devices can be described by reference to FIG. 1. We consider a two-terminal device configuration and begin with a device that has no voltage applied across it. When no voltage is applied across the chalcogenide material, the material is in a resistive state and no current flows. This condition corresponds to the origin of the I-V plot shown in FIG. 1. The chalcogenide remains in a resistive state as the applied voltage is increased, up to a threshold voltage (labeled $V_t$ in the first quadrant of FIG. 1). Associated with the threshold voltage is a threshold current (not labeled). The slope of the I-V curve for applied voltages between 0 and $V_t$ is small in magnitude and indicates that the chalcogenide material has a high electrical resistance, a circumstance reflected in the terminology "resistive branch" used to describe this portion of the I-V curve. The high resistance implies low electrical conductivity and as a result, the current flowing through the material increases only weakly as the applied voltage is increased. Since the current through the material is very small, the resistive state of the chalcogenide may also be referred to herein as the OFF state of the material.

When the applied voltage equals or exceeds the threshold voltage $V_t$, the chalcogenide material transforms (switches) from the resistive branch to the conductive branch of the I-V curve. The switching event occurs rapidly and is depicted by the dashed line in FIG. 1. Upon switching, the device voltage decreases significantly and the device current becomes much more sensitive to changes in the device voltage. Since the current through the material is greatly increased, the conductive state of the chalcogenide may also be referred to as the ON state or the dynamic state of the material.

The chalcogenide material remains in the conductive branch as long as a minimum current, labeled $I_h$ in FIG. 1, is maintained. We refer to $I_h$ as the holding current and the associated voltage $V_h$ as the holding voltage of the device. When the device switches from the resistive branch to the conductive branch, its characteristics are described by some state on the conductive branch and this state can be changed by varying the voltage applied across the device. If the device conditions after switching are changed so that the current becomes less than $I_h$, the material normally returns to the resistive branch of the I-V plot and requires re-application of a threshold voltage to resume operation on the conductive branch. If the current is only momentarily (a time less than the recovery time of the chalcogenide material) reduced below $I_h$, the conductive state of the chalcogenide may be recovered upon restoring the current to or above $I_h$. The recovery time of chalcogenide materials has been discussed in the article "Amorphous Semiconductors for Switching, Memory, and Imaging Applications" by S. R. Ovshinsky and H. Fritzsche and published in IEEE Transactions on Electronic Devices, vol. ED-20, p. 91-105 (1973).

The need to reduce the current below the holding current to switch the device back to the resistive state is a consequence of the latching characteristic of the chalcogenide switching materials. Once a chalcogenide switching material transforms from its resistive state to its conductive state, it "latches" into the conductive state and remains there without automatically reverting back to the resistive state. In order to return the material to its resistive state, it is necessary to reduce the current below the holding current. The proactive of reducing or eliminating the current must be taken in order to "unlatch" the device. As discussed hereinbelow, the latching characteristic of the chalcogenide switching materials imposes certain requirements on the design of the logic circuits of the instant invention. When the current of a device in the conductive state is reduced below the holding current, the device relaxes along dotted line shown in FIG. 1. Progress along the dotted line is irreversible and the current continuously decreases until the device relaxes back to the resistive branch as the conductive filament formed upon switching collapses.

FIG. 1 indicates a representative placement of the holding current on the I-V curve and specifically illustrates the common situation in which the holding current is below the current of the device immediately upon switching. The relative magnitudes of the holding current and current achieved immediately upon switching depend on factors such as the load resistance of the device and other factors related to the external circuit in which the device is placed. Although it is typical for the holding current to be less than the current obtained immediately upon switching, the circuitry and resistances can be configured so as to make the two currents nearly coincide. Similarly, the relative magnitudes of the holding current and the threshold current may vary with the device configuration, chalcogenide composition, and external circuitry.

Analogous switching behavior occurs in the third quadrant of the I-V plot shown in FIG. 1. Provided one is cognizant of the negative polarity of the I-V curve in the third quadrant, the switching behavior in the third quadrant is analogous to that described hereinabove for the first quadrant. For example, applied voltages having a magnitude greater than the magnitude of the negative threshold voltage in the third quadrant induce switching from the resistive branch to the conductive branch. We further note that although the resistive branch, conductive branch and sub-threshold current regimes are depicted with linear representations in FIG. 1, in practice slightly non-linear or curved representations of these portions of the I-V curve may be observed. Factors such as loads or resistances in the circuit external to the device and non-uniformities or imperfections in device fabrication may influence the shape of the different portions of the I-V curve. Accordingly, the depiction provided in FIG. 1 is intended to be schematic and a qualitative representation of the behavior of an actual device in practical operation.

Chalcogenide materials of many chemical compositions undergo the foregoing switching effect. Representative chalcogenide materials are those that include one or more elements from column VI of the periodic table (the chalcogen elements) and optionally one or more chemical modifiers from columns III. IV or V. One or more of S, Se, and Te are the most common chalcogen elements included in the active material of the instant devices. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament. Trivalent and tetravalent modifiers such as Al, Ga, In, Ge, Sn, Si, P, As, Pb, Bi and Sb enter the chain and ring structures of chalcogen elements and provide points for branching and crosslinking that can influence the structural rigidity of chalcogenide materials. Transition metals such as Cu, Ni, Zn, Ag, and Cd may also be used as modifiers. Chalcogenide switching materials and representative compositions have been previously described in U.S. Pat. Nos. 5,543, 737; 5,694,146; and 5,757,446.

The three-terminal chalcogenide switching devices discussed in the '344 patent and the '867 patent extend the functionality of the conventional two-terminal design. Inclusion of a third terminal provides a mechanism for controlling the operating conditions required to induce switching and effect filament formation between the other two terminals of the device. The third terminal may be referred to herein as a control terminal. In the three-terminal device design, the control terminal and two other terminals are in electrical communication with a chalcogenide switching material. The two non-control terminals may be referred to herein as switching terminals. In the three-terminal devices, application of a suitable control signal at the control terminal is used to influence the threshold switching voltage of the chalcogenide material between the two switching terminals. In the absence of a control signal, the chalcogenide material switches from a resistive state to a conductive state upon application of a threshold voltage across the switching terminals, where the magnitude of the threshold voltage corresponds to the threshold voltage that would be required to effect switching between the two switching terminals in the corresponding two-terminal device configuration. The presence of a suitable control signal at the control terminal of a three-terminal device can be used to control or vary the magnitude of the voltage required to effect the switching transition between the switching terminals. The control signal may be a current or voltage signal. Through use of a control signal, the threshold voltage between the two switching terminals of a three-terminal device can be changed to something different from the threshold voltage of the corresponding two-terminal device. As will be discussed in further detail below, it is possible, for example, with a control signal to effect a switching transition between the switching terminals when the voltage applied between the switching terminals is less than the threshold voltage that would be needed to effect switching in the corresponding two-terminal device.

Figure 2:
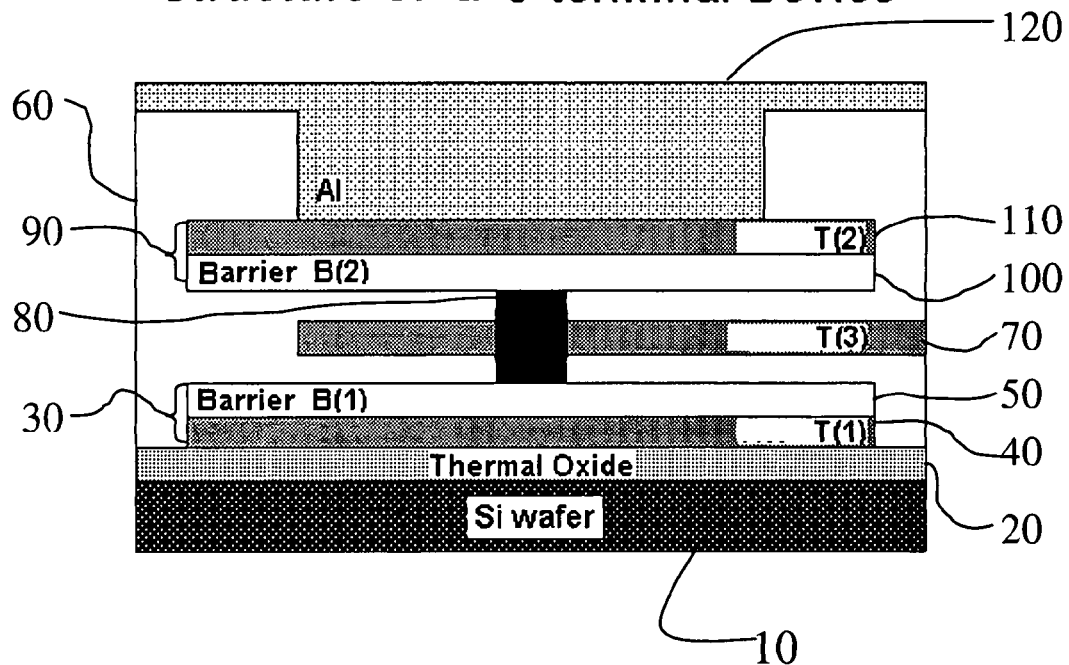
FIG. 2. Schematic depiction of an embodiment of a three-terminal chalcogenide device according to the instant invention.

An example of a three-terminal device structure is shown in FIG. 2. FIG. 2 shows a cross-sectional view of a three-terminal device structure. The three terminals are labeled T(1), T(2), and T(3). A plurality of these devices was formed on a 6" silicon wafer. The devices and layers on the wafer were formed using conventional sputtering, chemical vapor deposition, etching, and lithography techniques. The structure includes a silicon wafer substrate 10, a thermal oxide layer 20, a bottom terminal 30 that includes a conductive layer 40 formed from TiW or a combination of Ti and TiN and a carbon barrier layer 50, an $SiO_x/SiN_x$ insulating region 60, a control terminal 70 formed from TiW, a chalcogenide switching material 80, a top terminal 90 that includes a carbon barrier layer 100 and a conductive layer 110 that includes Ti and TiN, and an Al layer 120. The barrier layers inhibit diffusion and electromigration of material into the chalcogenide region and improve the cycle life of the device. Typical layer thicknesses are as follows: conductive layer 40 (100 nm), barrier layer 50 (30 nm), control terminal 70 (10-40 nm), barrier layer 100 (100 nm), and conductive layer 110 (100 nm). The region occupied by the chalcogenide material in the device of this example is cylindrical with a height of approximately 0.1 micron and a diameter of about 1 micron. The region occupied by the chalcogenide material may be referred to herein as the active region of the device. The terminals 30, 70 and 90 are in electrical communication with the chalcogenide material. The control terminal 70 circumscribes the chalcogenide material 80. The top terminal 90 and bottom terminal 30 may also be referred to as the upper and lower switching terminals, respectively. In many applications, the lower switching terminal is at ground. The terminals are separated by insulating material so that electrical communication between terminals occurs through the chalcogenide material.

Figure 3:
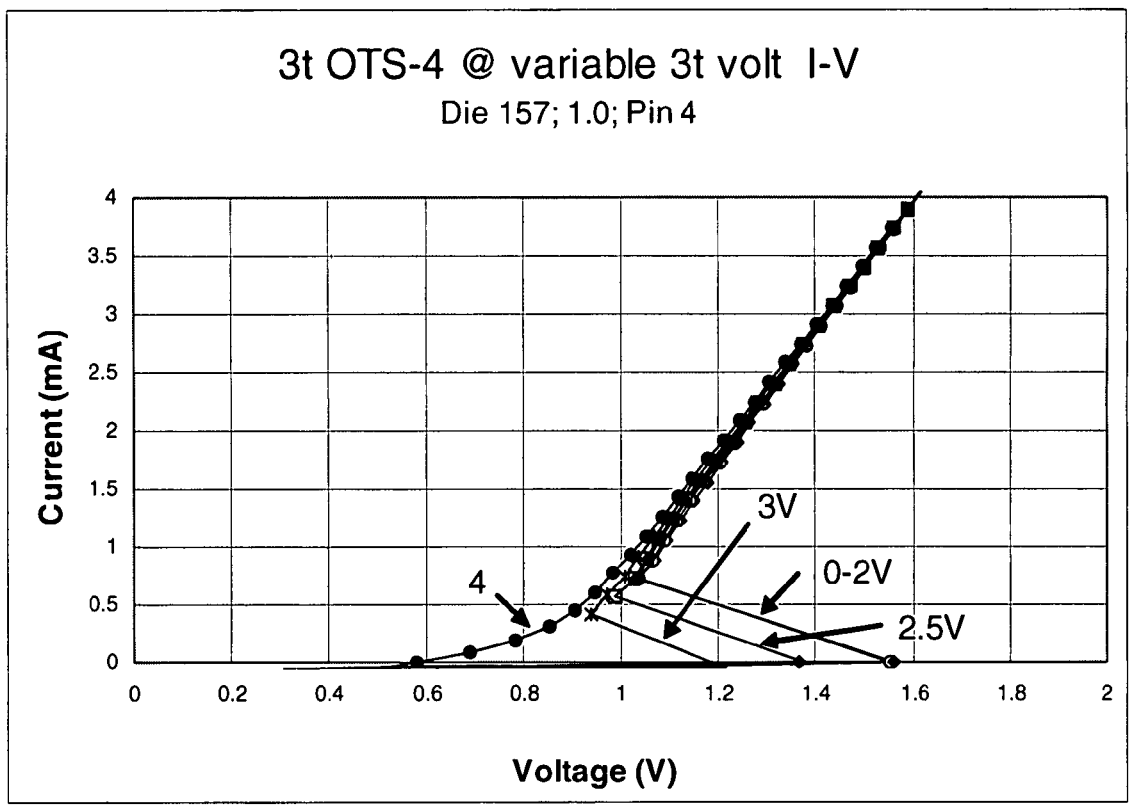
FIG. 3. I-V characteristics of the three-terminal device illustrated in FIG. 2.

Operational features of the three-terminal device structure depicted in FIG. 2 are presented in FIG. 3, which shows the first quadrant of an I-V plot for the three-terminal device. The current I corresponds to the current passing between the top terminal 90 and bottom terminal 30 of the device and the voltage V corresponds to the voltage applied between the top terminal 90 and bottom terminal 30. The I-V relationship between the top and bottom terminals was determined for a series of control voltages applied to the control terminal 70. In the measurements, a control voltage of a particular magnitude was applied to the control terminal 70 and the current between the top terminal 90 and bottom terminal 30 was measured as a function of the voltage applied between the top terminal 90 and bottom terminal 30. The control voltage was applied in the form of a long duration voltage pulse (e.g. 3 microseconds) and the voltage between the top terminal 90 and bottom terminal 30 was applied in the form of a short duration pulse (e.g. 100 nanoseconds) while the control voltage was being applied. In these measurements, the control voltage was applied between the control terminal 70 and bottom terminal 30 of the device.

The data in FIG. 3 indicate that application of a control voltage to the control terminal 70 may be used to modulate the threshold voltage between the top terminal 90 and bottom terminal 30. The different I-V curves shown in FIG. 3 correspond to results obtained when different control voltages are applied to the control terminal 70. The control voltage associated with each I-V curve is indicated in FIG. 3. The I-V curve labeled "0-2V" shows the behavior of the device for control voltages between 0 V and 2 V, inclusive. Since the I-V characteristics of the device are substantially identical for control voltages in this range, a single curve is presented for the several tests completed in this voltage range. The "0-2V" data indicate that the resistive branch of the I-V curve extends from an applied voltage of 0 V up to a voltage threshold of about 1.56 V. Once the threshold voltage is reached, the device switches to the conductive branch. As discussed in FIG. 1 hereinabove, the switching transformation is indicated by a negatively sloping line in the I-V curve.

When the control voltage is increased above 2 V, a decrease in the threshold voltage is observed. The I-V curve labeled "2.5V" indicates that a control voltage of 2.5 V reduces the threshold voltage by over 10% to a value slightly below 1.4 V. A further increase of the control voltage to 3 V leads to a decrease in the threshold voltage of about 25% to a value of about 1.2 V. When a control voltage of 4 V is applied, the threshold voltage is effectively eliminated and the chalcogenide material between the load and reference electrodes is in its conductive state over the full range of applied voltages tested.

The data presented in FIG. 3 demonstrate an ability to modulate the threshold voltage between two terminals of a multi-terminal device by applying a control voltage to a control terminal. The magnitude of the control voltage needed to modulate the threshold voltage can be established through the design of the device. Design parameters that can be used to influence the control voltage include the thickness and composition of the active chalcogenide material, the geometry of the active region of the device, the spatial separation between terminals, the composition and thickness of the terminals, and the quality of the interface between the terminals and the active chalcogenide material. It is also possible to influence the threshold voltage by applying a control signal between the intermediate control terminal and the top terminal of the device.

The logic circuits of the instant invention utilize a plurality of three-terminal chalcogenide switching devices and exploit the threshold voltage modulation capabilities of the devices to achieve logic functionality. The essential features of a fully functional family of logic circuits include a circuit capable of performing inversion and one or more circuits capable of performing a logical operation. Inversion is the ability to convert a binary "one" or "high" to a binary "zero" or "low"

and vice versa. The common logic operations include AND, OR, NAND, NOR, XOR, and XNOR. If the devices included in the logic circuits have a latching characteristic, as the chalcogenide switching devices do, the logic family further requires a mechanism for resetting the devices to ready them for the processing of subsequent input signals.

The instant logic circuits utilize a clocking scheme, such as four-phase clocking, to reset the chalcogenide switching devices after switching. A clocking scheme utilizes a time variable power signal to drive the devices that includes an ON or power-up cycle and an OFF or power-down cycle. When the clock is in its ON cycle, a chalcogenide switching device is able to latch and process a signal to produce a logical output in the instant logic circuits that can be read or directed to another circuit. Because of the latching property of the chalcogenide switching devices, the devices that are switched during the processing of an input signal remain in the conductive state until they are switched back to the resistive state by reducing the current. The necessary reduction of current occurs during the OFF cycle of the clocking scheme. In the OFF cycle, the current passing through the chalcogenide switching devices is terminated so that the devices can relax back to the resistive state.

Figure 4:
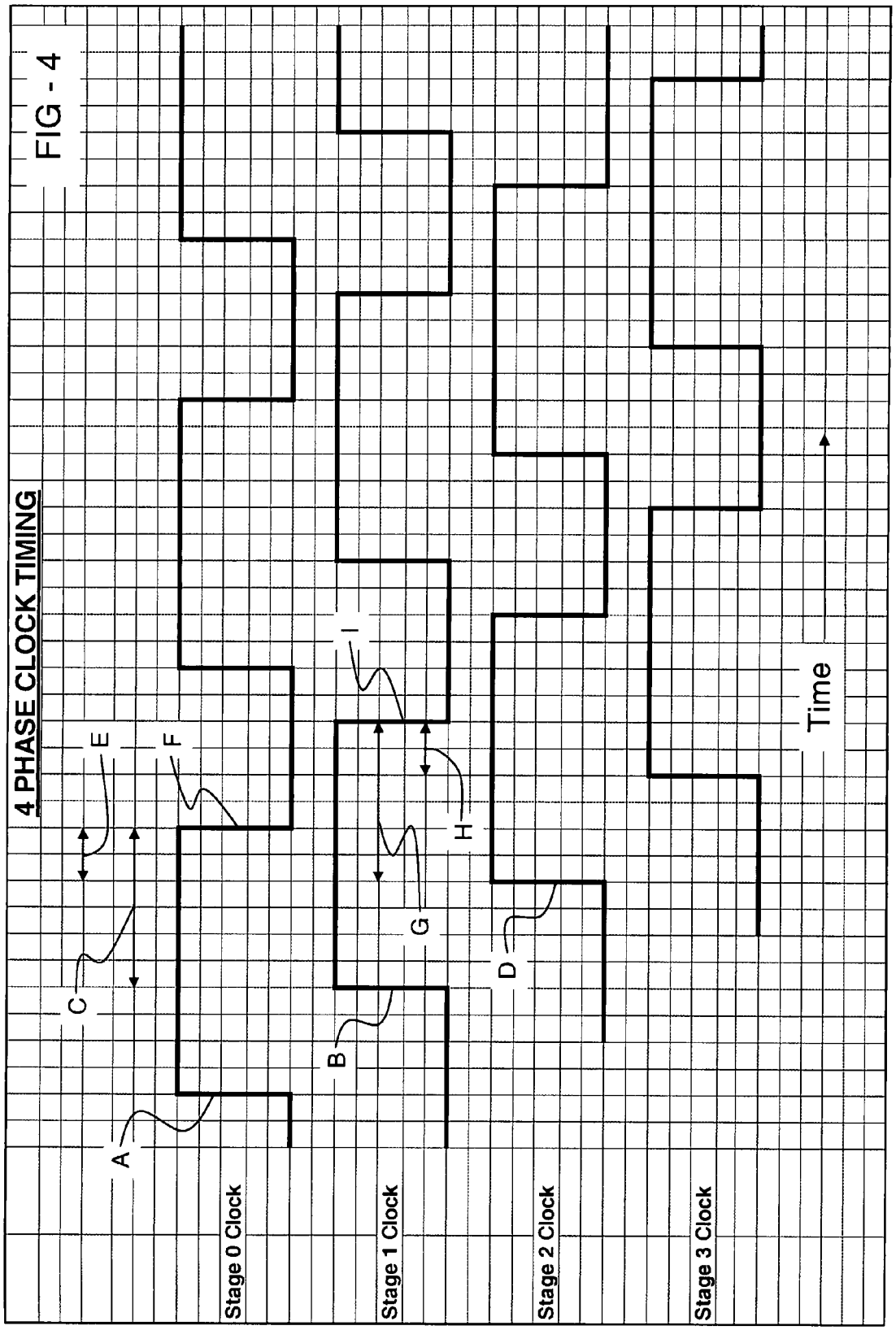
FIG. 4. Illustration of an embodiment of logic stage cycling using a clocking scheme.

An illustration of power cycling using a four-phase clocking scheme is depicted in FIG. 4. The clocking signal includes a higher voltage ON cycle and a lower voltage OFF cycle, where the signal alternates in time between the ON and OFF cycles. When the clocking signal is in its ON cycle, the circuit driven by the clocking signal may be said to be in its ON state and when the clocking signal is in its OFF cycle, the circuit driven by the clocking signal may be said to be in its OFF state. FIG. 4 shows the timing of the clock signal over four stages, where each stage represents a circuit that includes one or more devices and/or elements that are intended to operate collectively to perform combinational digital logic a/o process or transform a digital signal. The series of stages represents the progression of a digital signal from one circuit to another during processing. The initial input data signal is provided to the stage 0 circuit, is processed by the stage 0 circuit to provide an output data signal that is provided as an input to the stage 1 circuit for the next stage of processing. The sequence of signal processing continues through a series of stages according to the overall design of the circuit to provide an ultimate output, where each stage performs an intermediate step in the intended signal processing and the clocking scheme insures that the signal produced at each stage is properly transferred to the succeeding stage of the overall circuit.

In order to properly process the data signal, it is necessary to insure that each stage processes its input signals independently, without interference from other stages, and that communication between the different stages is limited to the transfer of a processed data signal from one stage to a succeeding stage in the system. The clocking scheme shown in FIG. 4 is representative of the many possible schemes known in the art that fulfill these requirements. Signal processing begins by powering the stage 0 circuit to its ON state with the clocking signal (shown as "A" in FIG. 4) and providing an initial signal to the stage 0 circuit. The stage 0 circuit processes the input signal over a certain time interval. During this time interval, current passes through the devices of the stage 0 circuit, the state of those devices may be altered in response to the current to produce an output state of the stage 0 circuit, and an output signal is generated according to that output state.

Once the output signal of the stage 0 circuit has been generated, it is necessary to transfer it to the stage 1 circuit for further processing. The transfer step is accomplished by powering the stage 1 circuit to its ON state with the stage 1 clocking signal (shown as "B" in FIG. 4) while keeping the stage 0 circuit in its ON state. Powering the stage 1 circuit to its ON state allows current to pass to it from the stage 0 circuit. Maintaining the stage 0 circuit in its ON state preserves the state of the stage 0 circuit that exists after it has processed the initial signal. This insures that the input signal transferred to the stage 1 circuit corresponds to the processed (output) signal of the stage 0 circuit.

The window of time over which both the stage 0 and stage 1 circuits are in their ON states is shown as "C" in FIG. 4. During this time period, the stage 1 circuit receives and processes the signal supplied to it from the stage 0 circuit and the stage 0 circuit is preserved in its output state. During processing, the devices of the stage 1 circuit respond to the current provided by the stage 0 circuit, the stage 1 circuit transforms to its output state and produces an output signal corresponding to its intended function.

The stage 1 output signal must next be transferred to the stage 2 circuit. The transfer begins by powering the stage 2 circuit to its ON state with the stage 2 clocking signal (shown as "D" in FIG. 4) and requires that the stage 1 circuit be maintained in its ON state to insure that the stage 1 output is provided as input to the stage 2 circuit. If the stage 0 circuit is powered down to its OFF state before the stage 2 circuit is powered up to its ON state, the stage 1 circuit will relax to its OFF state, the output signal of the stage 1 circuit will be lost, and the signal transfer from stage 1 to stage 2 will fail. Consequently, it is necessary to have some degree of overlap in time of the ON cycles of the stage 0 and stage 2 clocking signals. This time overlap is shown as "E" in FIG. 4 and in this time window, the clocking signals of the stage 0, stage 1, and stage 2 circuits are synchronized so that all three signals are simultaneously in their ON cycle. The stage 0, stage 1 and stage 2 circuits are simultaneously in their ON states. The stage 0 and stage 1 circuits are in their output states and the output signal from stage 1 is transferred to stage 2. Once the transfer occurs and the stage 2 circuit is powered to its ON state, the stage 0 circuit can be powered down to its OFF state by applying the OFF cycle of the stage 0 clocking signal (shown as "F" in FIG. 4). At this point in time, the ON cycle clocking signal of the stage 2 circuit insures that the stage 1 circuit remains in its output state. When the stage 0 clock is powered down, the current in the stage 0 circuit is terminated and any chalcogenide switching devices that have latched to their ON state, are returned to their OFF state and the stage 0 circuit is in a standby condition for processing of subsequent signals.

Once the signal is transferred to the stage 2 circuit, processing of the signal over a certain time window occurs to produce a output signal that will be transferred to the stage 3 circuit. The mechanism of stage 2 signal processing is analogous to that described above for stage 1 signal processing. There is a window of time (shown as "G" in FIG. 4) over which the stage 1 and stage 2 circuits are simultaneously in their ON states. In this time window, the stage 1 circuit is preserved in its output state so that the output signal of stage 1 is made available to the stage 2 circuit and the stage 2 circuit is capable of receiving current. Upon completion of stage 2 processing, the stage 2 output signal is transferred to the stage 3 circuit. As discussed above, proper signal transfer requires an interval of time (shown as "H" in FIG. 4) over which the stage 1, stage 2, and stage 3 circuits are simultaneously in their ON states. Once the stage 3 circuit is powered up and transfer of the output signal from the stage 2 circuit occurs, the stage 1 circuit can be powered down (shown as "I" in FIG.

4). Signal processing for later stages occurs in an analogous fashion until the ultimate output signal is produced.

Although the particular illustrative embodiment of four-phase clocking has been described herein, the principle of operation applies in general to n-phase clocking. Additional information about clocking schemes is provided, for example, in the '737 and '054 patents.

The following examples illustrate selected embodiments of the instant invention. The examples present logic circuits that can be constructed utilizing the three-terminal chalcogenide switching device described hereinabove. The embodiments are intended to be illustrative, rather than limiting, of the scope of the instant invention. It is further to be appreciated by those of skill in the art that all logic operations can be derived from a primitive set of operations. The following examples include more than the requisite primitive set of operations. Appropriate configurations of multiple NAND gates, for example, can provide circuits capable of performing AND, OR, NOR, XNOR, and XOR logic functions.

The representative circuits illustrated herein can be implemented as individual stages in a four-phase or other clocking scheme as described hereinabove. The following examples discuss operation of the circuits at the single-stage level. The instant invention further extends to multi-stage operation, where regulation and synchronization of the different stages proceeds according to the n phase clocking schemes described hereinabove or equivalents thereof.

Example 1

Figure 5:
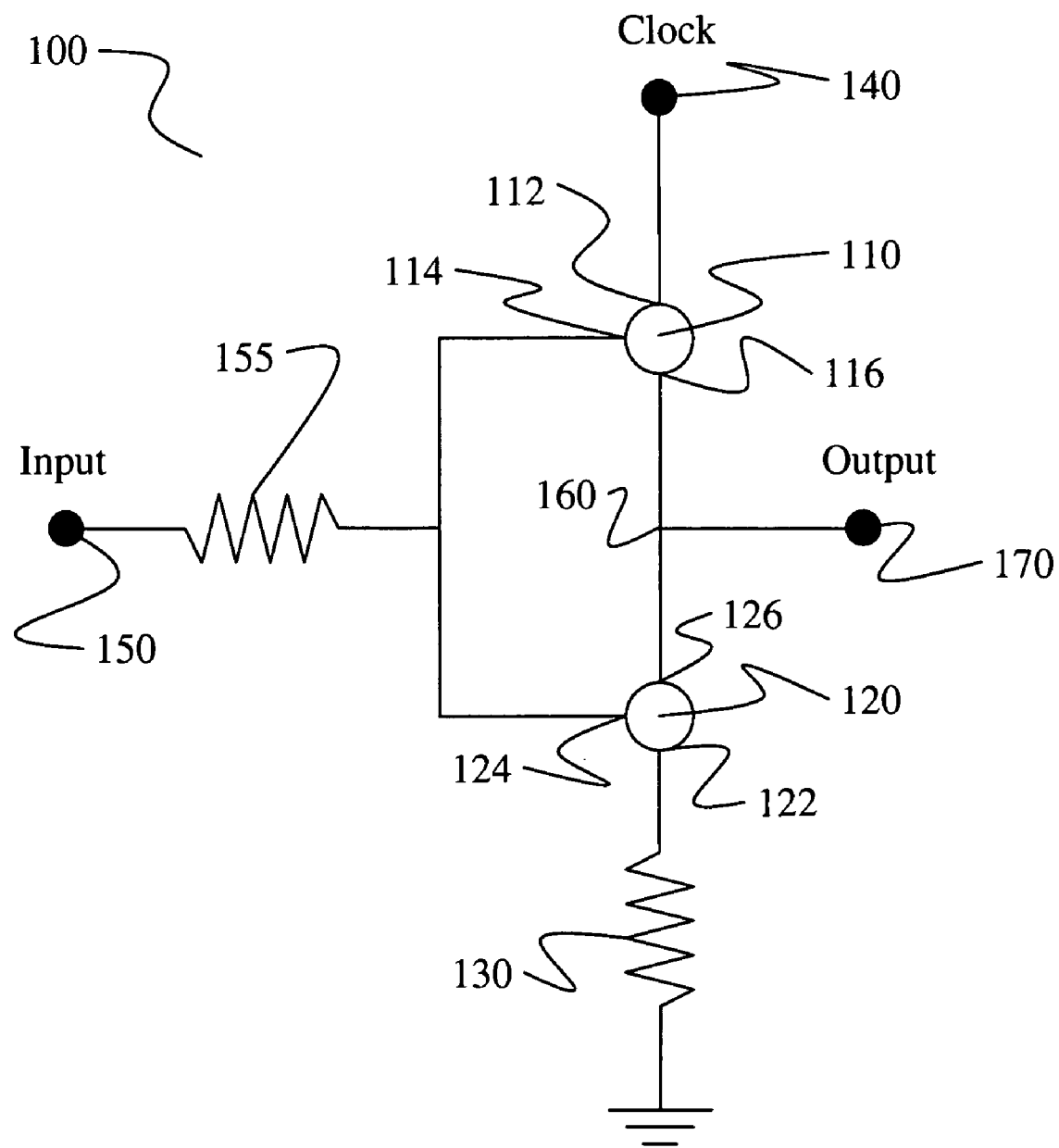
FIG. 5. Schematic depiction of an inverter circuit that includes three-terminal switching devices.

In this example, a logic circuit that performs an inversion operation is described. The circuit may be referred to herein as an inverter circuit or NOT circuit and is schematically depicted in FIG. 5. The inverter circuit 100 includes three-terminal chalcogenide switching devices 110 and 120, where switching device 120 is connected to ground via resistor 130. Switching device 110 includes terminals 112, 114, and 116 in electrical communication with a chalcogenide switching material and switching device 120 includes terminals 122, 124, and 126 in electrical communication with a chalcogenide switching material. The circuit also includes clock terminal 140 for applying a clock signal, input terminal 150, input resistor 155, output junction 160, and output terminal 170. The resistance of input resistor 155 is preferably smaller than the resistance of resistor 130 and can optionally be 0 ohms, effectively eliminating this component. The circuit receives an input signal at input terminal 150, processes it, and provides an output signal at output terminal 170.

Three-terminal device 110 has a threshold voltage between terminals 112 and 116 that can be modulated with a control signal provided at terminal 114. Three-terminal device 120 has a threshold voltage between terminals 122 and 126 that can be modulated with a control signal provided at terminal 124. For the embodiment described in this example, it is presumed that the threshold voltages for three-terminal devices 110 and 120 are the same. The scope of the instant invention, however, is not so limited and includes embodiments in which the threshold voltages of different three-terminal devices within a circuit differ. The clock signal applied to clock terminal 140 has a power up or ON cycle and a power down or OFF cycle as described hereinabove and depicted schematically in FIG. 4. When the clock signal is in its OFF cycle, the voltage at clock terminal 140 is at ground and no current passes between terminals 112 and 116 or between terminals 122 and 126. As described hereinabove, this characteristic of the clocking scheme permits the use of latching devices in a logic circuit by providing a mechanism for switching them off.

The voltage of the ON cycle of the clock signal can be adjusted. In the embodiment of this example, the voltage of the ON cycle is established at a value that is intermediate between ground voltage and the threshold voltage between terminals 112 and 116 of three-terminal device 110 and the threshold voltage between terminals 122 and 126 of three-terminal device 120. This selection of the ON cycle clock voltage means that when a clock signal is applied at clock terminal 140 and no input signal is applied at input terminal 150, neither three-terminal device 110 nor three-terminal device 120 switches. In the absence of an input signal, an ON cycle clock signal establishes a voltage across terminals 112 and 116 of three-terminal device 110 and a voltage across terminals 122 and 126 of three-terminal device 120, where each voltage is insufficient to switch. Devices 110 and 120 thus remain in their resistive or OFF state in the absence of an input signal when the clock signal is in its ON cycle.

During operation, an input signal supplied to input terminal 150 provides control signals to control terminals 114 and 124 of three-terminal devices 110 and 120, respectively. The input signal can be characterized in terms of its voltage relative to ground or some reference voltage. When the clock signal is in its ON cycle, control signals of sufficient magnitude, in combination with the voltage provided by the clock signal, effect a switching transition in device 110 or device 120. For three-terminal device 110, the magnitude of the control signal is assessed as the voltage between control terminal 114 and terminal 112. If the control signal is sufficient, a switching of device 110 from its resistive state to its conductive state between terminals 112 and 116 is induced. For three-terminal device 120, the magnitude of the control signal is assessed as the voltage between control terminal 124 and terminal 122. If the control signal is sufficient, a switching of device 120 from its resistive state to its conductive state between terminals 122 and 126 is induced.

The operation of the circuit requires the clock signal to be in its ON cycle with the ON cycle clock voltage being applied to clock terminal 140. With the clock signal in its ON cycle, an input signal is applied to input terminal 150. The value of the input signal dictates the value of the control signals established between terminals 114 and 112 of device 10 and between terminals 124 and 122 of device 120. The input signal preferably has a value either near the ON cycle clock voltage or near ground. The closer the magnitude of the input signal is to the ON cycle clock voltage, the smaller is the control signal between terminals 114 and 112 of device 110 and the larger is the control signal between terminals 124 and 122 of device 120. It thus becomes possible to identify an input signal whose magnitude, in combination with the voltage supplied by the clock signal, is sufficient to switch device 120 without being sufficient to switch device 110. An input signal having this characteristic is referred to as a high voltage input signal in the context of this example.

The closer the magnitude of the input signal is to the ground voltage, the larger is the control signal between terminals 114 and 112 of device 110 and the smaller is the control signal between terminals 124 and 122 of device 120. It thus becomes possible to identify an input signal whose magnitude, in combination with the voltage supplied by the clock signal, is sufficient to switch device 110 without being sufficient to switch device 120. An input signal having this characteristic is referred to as a low voltage input signal in the context of this example.

The operational characteristics of logic circuit 100 are summarized in the following table and are explained in further detail below.

| Input | 110 | 120 | Output |
|---|---|---|---|
| High | Resistive | Conductive | Low |
| Low | Conductive | Resistive | High |

The first row of the table indicates the column headings used to describe the operation of the circuit. The remaining rows of the table summarize the response of the circuit to various input signals provided as Input to the circuit. The column labeled Input indicates the type of signal provided at input 150 of the circuit. The signal provided is either high or low, where the characteristics associated with high and low signals are as described hereinabove. The columns labeled 110 and 120 list the state of three-terminal devices 110 and 120 in response to the indicated Input signal. The state of three-terminal devices 110 and 120 is listed as conductive or resistive, where conductive indicates that the device has switched and resistive indicates that the device has not switched in response to the indicated input signal. The final column of the table shows the signal produced by the circuit for each type of input signal. The output signal is the signal that appears at output terminal 170 and is listed as high or low, where the voltage of a high output signal is close to the voltage of the ON cycle of the clock signal and the voltage of a low output signal is close to the ground voltage.

When the clock signal applied to clock terminal 140 is in its ON cycle and a high voltage input signal is applied at input terminal 150, three-terminal device 120 switches from its resistive state to its conductive state. Three-terminal device 110, in contrast, does not switch and remains in its resistive state. Since device 120 switches to become conductive, the voltage across device 120 is approximately equal to the holding voltage. In a preferred embodiment, the holding voltage is much lower than the ON cycle voltage of the clock signal. As a result, since device 110 remains resistive when the input signal is a high voltage signal, the voltage of the clock signal drops primarily across device 110. This means that the ground voltage plus the holding voltage of device 120 results at output junction 160 to produce a low voltage output signal at output terminal 170. We therefore have the result that inverter circuit 100 transforms a high voltage input signal into a low voltage output signal.

When the clock signal applied to clock terminal 140 is in its ON cycle and a low voltage input signal is applied at input terminal 150, three-terminal device 110 switches from its resistive state to its conductive state. Three-terminal device 120, in contrast, does not switch and remains in its resistive state. Since device 110 switches to become conductive, the voltage across device 110 is approximately equal to the holding voltage. As indicated above, the holding voltage is preferably much lower than the ON cycle voltage of the clock signal. As a result, since device 120 remains resistive when the input signal is a low voltage input signal, the voltage of the clock signal drops primarily across device 120. This means that the ON cycle clock voltage reduced by the holding voltage of device 110 results at output junction 160 to produce a high voltage output signal at output terminal 170. We therefore have the result that inverter circuit 100 transforms a low voltage input signal into a high voltage output signal.

This example demonstrates a logic circuit capable of performing signal inversion. A high input signal is processed by the circuit to produce a low output signal and a low input signal is processed by the circuit to produce a high output signal. The circuit includes a plurality of three-terminal chalcogenide switching devices.

Example 2

Figure 6:
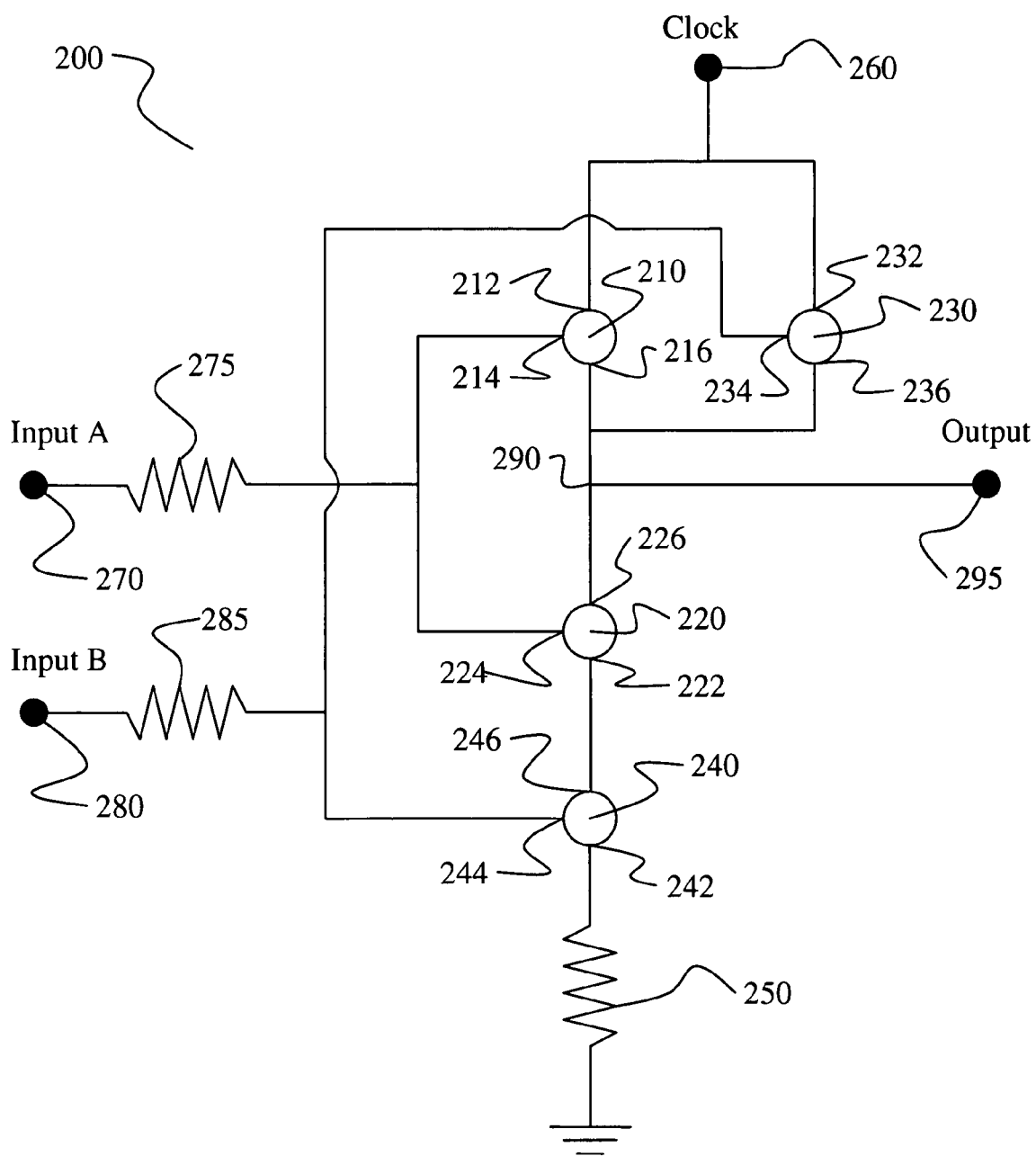
FIG. 6. Schematic depiction of a NAND circuit that includes three-terminal switching devices.

In this example, a logic circuit that performs the NAND operation is described. The circuit may be referred to herein as a NAND circuit and is schematically depicted in FIG. 6. The NAND circuit 200 includes three-terminal chalcogenide switching devices 210, 220, 230 and 240 where switching device 240 is connected to ground via resistor 250. Switching device 210 includes terminals 212, 214, and 216 in electrical communication with a chalcogenide switching material; switching device 220 includes terminals 222, 224, and 226 in electrical communication with a chalcogenide switching material; switching device 230 includes terminals 232, 234, and 236 in electrical communication with a chalcogenide switching material; and switching device 240 includes terminals 242, 244, and 246 in electrical communication with a chalcogenide switching material. The circuit also includes clock terminal 260 for applying a clock signal, input terminals 270 and 280, input resistors 275 and 285, output junction 290, and output terminal 295. The input signals provided to input terminals 270 and 280 may be referred to herein as input A and input B, respectively. The resistance of input resistors 275 and 285 is preferably smaller than the resistance of resistor 250 and can optionally be 0 ohms, effectively eliminating these components. The circuit receives a pair of input signals at input terminals 270 and 280, processes them, and provides an output signal at output terminal 295.

Three-terminal device 210 has a threshold voltage between terminals 212 and 216 that can be modulated with a control signal provided at terminal 214. Three-terminal device 220 has a threshold voltage between terminals 222 and 226 that can be modulated with a control signal provided at terminal 224. Three-terminal device 230 has a threshold voltage between terminals 232 and 236 that can be modulated with a control signal provided at terminal 234. Three-terminal device 240 has a threshold voltage between terminals 242 and 246 that can be modulated with a control signal provided at terminal 244. For the embodiment described in this example, it is presumed that the threshold voltages for three-terminal devices 210, 220, 230 and 240 are the same. The scope of the instant invention, however, is not so limited and includes embodiments in which the threshold voltages of different three-terminal devices within a circuit differ.

The clock signal applied to clock terminal 260 has a power up or ON cycle and a power down or OFF cycle as described hereinabove and depicted schematically in FIG. 4. When the clock signal is in its OFF cycle, the voltage at clock terminal 260 is at ground and no current passes between terminals 212 and 216; between terminals 222 and 226; between terminals 232 and 236; between terminals 242 and 246. As described hereinabove, this characteristic of the clocking scheme permits the use of latching devices in a logic circuit by providing a mechanism for switching them off.

The voltage of the ON cycle of the clock signal can be adjusted. In the embodiment of this example, the voltage of the ON cycle is established at a value that is intermediate between ground voltage and the threshold voltage between the terminals three-terminal devices 210, 220, 230, and 240 described above. This selection of the ON cycle clock voltage means that when a clock signal is applied at clock terminal 260 and no input signals are applied at input terminals 270 and 280, none of three-terminal devices 210, 220, 230 and 240 switches. In the absence of input signals, an ON cycle clock signal establishes voltages across terminals 212 and 216 of three-terminal device 210, across terminals 222 and 226 of three-terminal device 220, across terminals 232 and 236 of three-terminal device 230, and across terminals 242 and 246 of three-terminal device 240, where each voltage is insufficient to switch. Devices 210, 220, 230 and 240 thus remain in their resistive or OFF state in the absence of an input signal when the clock signal is in its ON cycle.

The operation of logic circuit 200 can be conceptualized as two sub-circuits, where each sub-circuit operates in a manner analogous to the operation of the inverter circuit described in EXAMPLE 1 hereinabove. A first sub-circuit includes input terminal 270 for receiving input signal A, input resistor 275, clock terminal 260, three-terminal switching devices 210 and 220, resistor 250 and output terminal 295. A second sub-circuit includes input terminal 280 for receiving input signal B, input resistor 285, clock terminal 260, three-terminal switching devices 230 and 240, resistor 250 and output terminal 295. If three-terminal device 230 is in the off state (resistive state) and three terminal device 240 is in the on state (conductive state), the sub-circuit that receives input signal A behaves analogous to the inverter circuit described in EXAMPLE 1 hereinabove. If three-terminal device 210 is in the off state (resistive state) and three terminal device 220 is in the on state (conductive state), the sub-circuit that receives input signal B behaves analogous to the inverter circuit described in EXAMPLE 1 hereinabove. By combining the two sub-circuits as shown in FIG. 6, logic functionality according to the NAND operation is achieved.

During operation, input signals A and B are applied to input terminals 270 and 280, respectively. The input signal supplied to input terminal 270 provides control signals to control terminals 214 and 224 of three-terminal devices 210 and 220, respectively. The input signal can be characterized in terms of its voltage relative to ground or some reference voltage. When the clock signal is in its ON cycle, control signals of sufficient magnitude, in combination with the voltage provided by the clock signal, effect a switching transition in device 210 or device 220. For three-terminal device 210, the magnitude of the control signal is assessed as the voltage between control terminal 214 and terminal 212. If the control signal is sufficient, a switching of device 210 from its resistive state to its conductive state between terminals 212 and 216 is induced. For three-terminal device 220, the magnitude of the control signal is assessed as the voltage between control terminal 224 and terminal 222. If the control signal is sufficient, a switching of device 220 from its resistive state to its conductive state between terminals 222 and 226 is induced.

The input signal supplied to input terminal 280 provides control signals to control terminals 234 and 244 of three-terminal devices 230 and 240, respectively. The input signal can be characterized in terms of its voltage relative to ground or some reference voltage. When the clock signal is in its ON cycle, control signals of sufficient magnitude, in combination with the voltage provided by the clock signal, effect a switching transition in device 230 or device 240. For three-terminal device 230, the magnitude of the control signal is assessed as the voltage between control terminal 234 and terminal 232. If the control signal is sufficient, a switching of device 230 from its resistive state to its conductive state between terminals 232 and 236 is induced. For three-terminal device 240, the magnitude of the control signal is assessed as the voltage between control terminal 244 and terminal 242. If the control signal is sufficient, a switching of device 240 from its resistive state to its conductive state between terminals 242 and 246 is induced.

The operation of the circuit requires the clock signal to be in its ON cycle with the ON cycle clock voltage being applied to clock terminal 260. With the clock signal in its ON cycle, input signal A is applied to input terminal 270. The magnitude of input signal A dictates the magnitude of the control signals established between terminals 214 and 212 of device 210 and between terminals 224 and 222 of device 220. Input signal A preferably has a value near the ON cycle clock voltage or near to ground. The closer the magnitude of the input signal is to the ON cycle clock voltage, the smaller is the control signal between terminals 214 and 212 of device 210 and the larger is the control signal between terminals 224 and 222 of device 220. It thus becomes possible to identify an input signal whose magnitude, in combination with the voltage supplied by the clock signal, is sufficient to switch device 220 without being sufficient to switch device 210. An input signal applied to input terminal 270 that has this characteristic is referred to as a high voltage input signal A in the context of this example.

The closer the magnitude of input signal A is to the ground voltage, the larger is the control signal between terminals 214 and 212 of device 210 and the smaller is the control signal between terminals 224 and 222 of device 220. It thus becomes possible to identify an input signal A whose magnitude, in combination with the voltage supplied by the clock signal, is sufficient to switch device 210 without being sufficient to switch device 220. An input signal applied to input terminal 270 that has this characteristic is referred to as a low voltage input signal A in the context of this example.

With the clock signal in its ON cycle, input signal B is applied to input terminal 280. The magnitude of input signal B dictates the magnitude of the control signals established between terminals 234 and 232 of device 230 and between terminals 244 and 242 of device 240. Input signal B preferably has a value near the ON cycle clock voltage or near ground. The closer the magnitude of the input signal is to the ON cycle clock voltage, the smaller is the control signal between terminals 234 and 232 of device 230 and the larger is the control signal between terminals 244 and 242 of device 240. It thus becomes possible to identify an input signal whose magnitude, in combination with the voltage supplied by the clock signal, is sufficient to switch device 240 without being sufficient to switch device 230. An input signal applied to input terminal 280 that has this characteristic is referred to as a high voltage input signal B in the context of this example.

The closer the magnitude of input signal B is to the ground voltage, the larger is the control signal between terminals 234 and 232 of device 230 and the smaller is the control signal between terminals 244 and 242 of device 240. It thus becomes possible to identify an input signal B whose magnitude, in combination with the voltage supplied by the clock signal, is sufficient to switch device 230 without being sufficient to switch device 240. An input signal applied to input terminal 280 that has this characteristic is referred to as a low voltage input signal B in the context of this example.

The operational characteristics of logic circuit 200 are summarized in the following table and are explained in further detail below.

| Input A | 210 | 220 | Input B | 230 | 240 | Output |
|---------|-----------|------------|---------|------------|------------|--------|
| High | Resistive | Conductive | High | Resistive | Conductive | Low |
| High | Resistive | Conductive | Low | Conductive | Resistive | High |
| Low | Conductive | Resistive | High | Resistive | Conductive | High |
| Low | Conductive | Resistive | Low | Conductive | Resistive | High |

The first row of the table indicates the column headings used to describe the operation of the circuit. The remaining rows of the table summarize the response of the circuit to various input signals provided as Input A and Input B to the circuit. The columns labeled Input A and Input B indicate the type of signal provided at inputs 270 and 280, respectively, of the circuit. The signals provided are either high or low, where the characteristics associated with high and low signals are as described hereinabove. The columns labeled 210 and 220 list the state of three-terminal devices 210 and 220 in response to the indicated Input A signal. The columns labeled 230 and 240 list the state of three-terminal devices 230 and 240 in response to the indicated Input B signal. The state of three-terminal devices 210, 220, 230, and 240 is listed as conductive or resistive, where conductive indicates that the device has switched and resistive indicates that the device has not switched in response to the indicated input signal. The final column of the table shows the signal produced by the circuit for each combination of Input A and Input B signals. The output signal is the signal that appears at output terminal 295 and is listed as high or low, where the voltage of a high output signal is closer in value to the voltage of the ON cycle of the clock signal than is a low output signal.

The output of the circuit can be analyzed for different combinations of the inputs provided as Input A and Input B. The responses of the three terminal devices to the input signals can be determined in a manner similar to that described in EXAMPLE 1 for the inverter circuit. Input A and three-terminal devices 210 and 220 correspond to a sub-circuit that behaves analogous to the inverter circuit. Similarly, Input B and three-terminal devices 230 and 240 correspond to a sub-circuit that behaves analogous to the inverter circuit. As in the discussion of the inverter circuit in EXAMPLE 1, we presume that the threshold and holding voltages of devices 210, 220, 230, and 240 are approximately the same and that the holding voltage is much lower than the ON cycle voltage of the clock signal. The collective response of the two sub-circuits dictates the output of the circuit. The signal produced at output terminal 295 corresponds to the signal appearing at output junction 290 and the signal appearing at output junction 290 is controlled by the configuration of the three-terminal devices in the circuit and whether the three-terminal devices are switched into their conductive state or not.

Three-terminal devices 210 and 230 are arranged in a parallel configuration between clock terminal 260 and output junction 290. This means that if either device 210 or device 230 is switched to its conductive state, the voltage of the clock signal (less the holding voltage) is pulled down to output junction 290. Three-terminal devices 220 and 240, in contrast, are arranged in a series configuration between output junction 290 and ground. This means that both devices 220 and 240 must be switched to their conductive states in order for the ground voltage plus twice the holding voltage to result at output junction 290.

We begin by analyzing the operation of the circuit 200 when a high voltage signal is applied as Input A and a high voltage signal is applied as Input B. When the clock signal applied to clock terminal 260 is in its ON cycle and a high voltage input signal A is applied at input terminal 270, three-terminal device 220 switches from its resistive state to its conductive state. Three-terminal device 210, in contrast, does not switch and remains in its resistive state. Similarly, when a high voltage input signal B is applied at input terminal 280, three-terminal device 240 switches from its resistive state to its conductive state. Three-terminal device 230, in contrast, does not switch and remains in its resistive state. Since both device 220 and device 240 are switched to their conductive states, the pathway connecting output junction 290 and ground becomes conductive pulling down the output junction 290 to near ground. Since both device 210 and device 230 remain resistive, the voltage of the ON cycle clock signal drops primarily between clock terminal 260 and output junction 290. The net result is that a low voltage signal (having a value of approximately twice the holding voltage above ground) appears at output junction 290 to provide a low voltage output signal at output terminal 295.

We continue by analyzing the operation of the circuit 200 when a high voltage signal is applied as Input A and a low voltage signal is applied as Input B. When the clock signal applied to clock terminal 260 is in its ON cycle and a high voltage input signal A is applied at input terminal 270, three-terminal device 220 switches from its resistive state to its conductive state. Three-terminal device 210, in contrast, does not switch and remains in its resistive state. When a low voltage input signal B is applied at input terminal 280, three-terminal device 230 switches from its resistive state to its conductive state. Three-terminal device 240, in contrast, does not switch and remains in its resistive state. Since device 230 is switched to its conductive state, a pathway connecting clock terminal 260 and output junction 290 becomes conductive and the ON cycle clock voltage (less the holding voltage of device 230) results at output junction 290. Since device 240 remains resistive, the voltage of the ON cycle clock signal drops primarily across device 240 (i.e. between output junction 290 and ground). The net result is that a high voltage signal (having a magnitude of approximately the ON cycle clock voltage less the holding voltage) appears at output junction 290 to provide a high voltage output signal at output terminal 295.

We continue by analyzing the operation of the circuit 200 when a low voltage signal is applied as Input A and a high voltage signal is applied as Input B. When the clock signal applied to clock terminal 260 is in its ON cycle and a low voltage input signal A is applied at input terminal 270, three-terminal device 210 switches from its resistive state to its conductive state. Three-terminal device 220, in contrast, does not switch and remains in its resistive state. When a high voltage input signal B is applied at input terminal 280, three-terminal device 240 switches from its resistive state to its conductive state. Three-terminal device 230, in contrast, does not switch and remains in its resistive state. Since device 210 is switched to its conductive state, a pathway connecting clock terminal 260 and output junction 290 becomes conductive and the ON cycle clock voltage (less the holding voltage of device 210) results at output junction 290. Since device 220 remains resistive, the voltage of the ON cycle clock signal drops primarily across device 220 (i.e. between output junction 290 and ground). The net result is that a high voltage signal (having a magnitude of approximately the ON cycle clock voltage less the holding voltage) appears at output junction 290 to provide a high voltage output signal at output terminal 295.

We continue by analyzing the operation of the circuit 200 when a low voltage signal is applied as Input A and a low voltage signal is applied as Input B. When the clock signal applied to clock terminal 260 is in its ON cycle and a low voltage input signal A is applied at input terminal 270, three-terminal device 210 switches from its resistive state to its conductive state. Three-terminal device 220, in contrast, does not switch and remains in its resistive state. When a low voltage input signal B is applied at input terminal 280, three-terminal device 230 switches from its resistive state to its conductive state. Three-terminal device 240, in contrast, does not switch and remains in its resistive state. Since both devices 210 and 230 are switched to their conductive states, a pathway connecting clock terminal 260 and output junction 290 becomes conductive and the ON cycle clock voltage (less the holding voltage) results at output junction 290. Since devices 220 and 240 remain resistive, the voltage of the ON cycle clock signal drops primarily between output junction 290 and ground. The net result is that a high voltage signal (having a value of approximately the ON cycle clock voltage less the holding voltage) appears at output junction 290 to provide a high voltage output signal at output terminal 295.

The relationship of the two inputs to the output summarized in the table above for the circuit described in this example corresponds to the NAND logical operation.

Example 3

Figure 7:
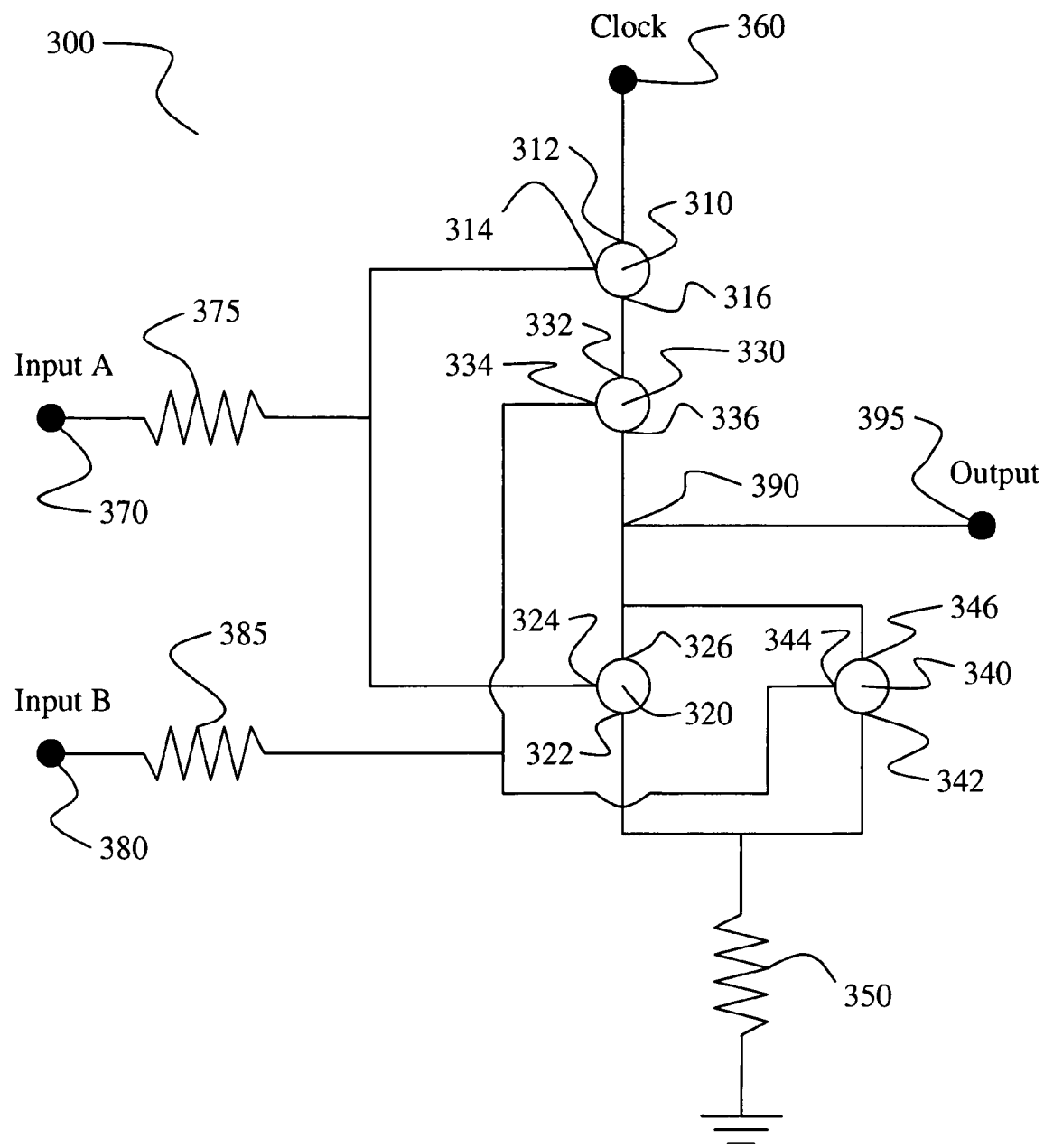
FIG. 7. Schematic depiction of a NOR circuit that includes three-terminal switching devices.

In this example, a logic circuit that performs the NOR operation is described. The circuit may be referred to herein as a NOR circuit and is schematically depicted in FIG. 7. The NOR circuit 300 includes three-terminal chalcogenide switching devices 310, 320, 330 and 340 where switching devices 320 and 340 are connected to ground via resistor 350. Switching device 310 includes terminals 312, 314, and 316 in electrical communication with a chalcogenide switching material; switching device 320 includes terminals 322, 324, and 326 in electrical communication with a chalcogenide switching material; switching device 330 includes terminals 332, 334, and 336 in electrical communication with a chalcogenide switching material; and switching device 340 includes terminals 342, 344, and 346 in electrical communication with a chalcogenide switching material. The circuit also includes clock terminal 360 for applying a clock signal, input terminals 370 and 380, input resistors 375 and 385, output junction 390, and output terminal 395. The input signals provided to input terminals 370 and 380 may be referred to herein as input A and input B, respectively. The resistance of input resistors 375 and 385 is preferably smaller than the resistance of resistor 350 and can optionally be 0 ohms, effectively eliminating these components. The circuit receives a pair of input signals at input terminals 370 and 380, processes them, and provides an output signal at output terminal 395.

Three-terminal device 310 has a threshold voltage between terminals 312 and 316 that can be modulated with a control signal provided at terminal 314. Three-terminal device 320 has a threshold voltage between terminals 322 and 326 that can be modulated with a control signal provided at terminal 324. Three-terminal device 330 has a threshold voltage between terminals 332 and 336 that can be modulated with a control signal provided at terminal 334. Three-terminal device 340 has a threshold voltage between terminals 342 and 346 that can be modulated with a control signal provided at terminal 344. For the embodiment described in this example, it is presumed that the threshold voltages for three-terminal devices 310, 320, 330 and 340 are the same. The scope of the instant invention, however, is not so limited and includes embodiments in which the threshold voltages of different three-terminal devices within a circuit differ.

The clock signal applied to clock terminal 360 has a power up or ON cycle and a power down or OFF cycle as described hereinabove and depicted schematically in FIG. 4. When the clock signal is in its OFF cycle, the voltage at clock terminal 360 is at ground and no current passes between terminals 312 and 316; between terminals 322 and 326; between terminals 332 and 336; between terminals 342 and 346. As described hereinabove, this characteristic of the clocking scheme permits the use of latching devices in a logic circuit by providing a mechanism for switching them off.

The voltage of the ON cycle of the clock signal can be adjusted. In the embodiment of this example, the voltage of the ON cycle is established at a value that is intermediate between ground voltage and the threshold voltage between the terminals 312 and 316 of three-terminal device 310 when no control signal 314 is applied; intermediate between ground voltage and the threshold voltage between the terminals 322 and 326 of three-terminal device 320 when no control signal 324 is applied; intermediate between ground voltage and the threshold voltage between the terminals 332 and 336 of three-terminal device 330 when no control signal 334 is applied; and intermediate between ground voltage and the threshold voltage between the terminals 342 and 346 of three-terminal device, and 340 when no control signal 344 is applied; all as described above. This selection of the ON cycle clock voltage means that when a clock signal is applied at clock terminal 360 and no input signals are applied at input terminals 370 and 380, none of three-terminal devices 310, 320, 330 and 340 switches. In the absence of input signals, an ON cycle clock signal establishes voltages across terminals 312 and 316 of three-terminal device 310, across terminals 322 and 326 of three-terminal device 320, across terminals 332 and 336 of three-terminal device 330, and across terminals 342 and 346 of three-terminal device 340, where each voltage is insufficient to switch. Devices 310, 320, 330 and 340 thus remain in their resistive or OFF state in the absence of an input signal when the clock signal is in its ON cycle.

The operation of logic circuit 300 can be conceptualized as two sub-circuits, where each sub-circuit operates in a manner analogous to the operation of the inverter circuit described in EXAMPLE 1 hereinabove. A first sub-circuit includes input terminal 370 for receiving input signal A, input resistor 375, clock terminal 360, three-terminal switching devices 310 and 320, resistor 350 and output terminal 395. A second sub-circuit includes input terminal 380 for receiving input signal B, input resistor 385, clock terminal 360, three-terminal switching devices 330 and 340, resistor 350 and output terminal 395. If three-terminal devices 330 and 340 are in their conductive state, the sub-circuit that receives input signal A behaves analogous to the inverter circuit described in EXAMPLE 1 hereinabove. If three-terminal device 310 is in its conductive state and three-terminal device 320 is in its resistive state, the sub-circuit that receives input signal B behaves analogous to the inverter circuit described in EXAMPLE 1 hereinabove. By combining the two sub-circuits as shown in FIG. 7, logic functionality according to the NOR operation is achieved.

During operation, input signals A and B are applied to input terminals 370 and 380, respectively. The input signal supplied to input terminal 370 provides control signals to control terminals 314 and 324 of three-terminal devices 310 and 320, respectively. The input signal can be characterized in terms of its voltage relative to ground or some reference voltage. When the clock signal is in its ON cycle, control signals of sufficient magnitude, in combination with the voltage provided by the clock signal, effect a switching transition in device 310 or device 320. For three-terminal device 310, the magnitude of the control signal is assessed as the voltage between control terminal 314 and terminal 312. If the control signal is sufficient, a switching of device 310 from its resistive state to its conductive state between terminals 312 and 316 is induced. For three-terminal device 320, the magnitude of the control signal is assessed as the voltage between control terminal 324 and terminal 322. If the control signal is sufficient, a switching of device 320 from its resistive state to its conductive state between terminals 322 and 326 is induced.

The input signal supplied to input terminal 380 provides control signals to control terminals 334 and 344 of three-terminal devices 330 and 340, respectively. The input signal can be characterized in terms of its voltage relative to ground or some reference voltage. When the clock signal is in its ON cycle, control signals of sufficient magnitude, in combination with the voltage provided by the clock signal, effect a switching transition in device 330 or device 340. For three-terminal device 330, the magnitude of the control signal is assessed as the voltage between control terminal 334 and terminal 332. If the control signal is sufficient, a switching of device 330 from its resistive state to its conductive state between terminals 332 and 336 is induced. For three-terminal device 340, the magnitude of the control signal is assessed as the voltage between control terminal 344 and terminal 342. If the control signal is sufficient, a switching of device 340 from its resistive state to its conductive state between terminals 342 and 346 is induced.

The operation of the circuit requires the clock signal to be in its ON cycle with the ON cycle clock voltage being applied to clock terminal 360. With the clock signal in its ON cycle, input signal A is applied to input terminal 370. The magnitude of input signal A dictates the magnitude of the control signals established between terminals 314 and 312 of device 310 and between terminals 324 and 322 of device 320. Input signal A preferably has a value close to the ON cycle clock voltage or close to ground. The closer the magnitude of the input signal is to the ON cycle clock voltage, the smaller is the control signal between terminals 314 and 312 of device 310 and the larger is the control signal between terminals 324 and 322 of device 320. It thus becomes possible to identify an input signal whose magnitude, in combination with the voltage supplied by the clock signal, is sufficient to switch device 320 without being sufficient to switch device 310. An input signal applied to input terminal 370 that has this characteristic is referred to as a high voltage input signal A in the context of this example.

The closer the magnitude of input signal A is to the ground voltage, the larger is the control signal between terminals 314 and 312 of device 310 and the smaller is the control signal between terminals 324 and 322 of device 320. It thus becomes possible to identify an input signal A whose magnitude, in combination with the voltage supplied by the clock signal, is sufficient to switch device 310 without being sufficient to switch device 320. An input signal applied to input terminal 370 that has this characteristic is referred to as a low voltage input signal A in the context of this example.

With the clock signal in its ON cycle, input signal B is applied to input terminal 380. The magnitude of input signal B dictates the magnitude of the control signals established between terminals 334 and 332 of device 330 and between terminals 344 and 342 of device 340. Input signal B preferably has a value near the ON cycle clock voltage or near to ground. The closer the magnitude of the input signal is to the ON cycle clock voltage, the smaller is the control signal between terminals 334 and 332 of device 330 and the larger is the control signal between terminals 344 and 342 of device 340. It thus becomes possible to identify an input signal whose magnitude, in combination with the voltage supplied by the clock signal, is sufficient to switch device 340 without being sufficient to switch device 330. An input signal applied to input terminal 380 that has this characteristic is referred to as a high voltage input signal B in the context of this example.

The closer the magnitude of input signal B is to the ground voltage, the larger is the control signal between terminals 334 and 332 of device 330 and the smaller is the control signal between terminals 344 and 342 of device 340. It thus becomes possible to identify an input signal B whose magnitude, in combination with the voltage supplied by the clock signal, is sufficient to switch device 330 without being sufficient to switch device 340. An input signal applied to input terminal 380 that has this characteristic is referred to as a low voltage input signal B in the context of this example.

The operational characteristics of logic circuit 300 are summarized in the following table and are explained in further detail below.

| Input A | 310 | 320 | Input B | 330 | 340 | Output |
|---|---|---|---|---|---|---|
| High | Resistive | Conductive | High | Resistive | Conductive | Low |
| High | Resistive | Conductive | Low | Conductive | Resistive | Low |
| Low | Conductive | Resistive | High | Resistive | Conductive | Low |
| Low | Conductive | Resistive | Low | Conductive | Resistive | High |

The first row of the table indicates the column headings used to describe the operation of the circuit. The remaining rows of the table summarize the response of the circuit to various input signals provided as Input A and Input B to the circuit. The columns labeled Input A and Input B indicate the type of signal provided at inputs 370 and 380, respectively, of the circuit. The signals provided are either high or low, where the characteristics associated with high and low signals are as described hereinabove. The columns labeled 310 and 320 list the state of three-terminal devices 310 and 320 in response to the indicated Input A signal. The columns labeled 330 and 340 list the state of three-terminal devices 330 and 340 in response to the indicated Input B signal. The state of three-terminal devices 310, 320, 330, and 340 is listed as conductive or resistive, where conductive indicates that the device has switched and resistive indicates that the device has not switched in response to the indicated input signal. The final column of the table shows the signal produced by the circuit for each combination of Input A and Input B signals. The output signal is the signal that appears at output terminal 395 and is listed as high or low, where the voltage of a high output signal is closer in value to the voltage of the ON cycle of the clock signal than is a low output signal.

The output of the circuit can be analyzed for different combinations of the inputs provided as Input A and Input B. The responses of the three terminal devices to the input signals can be determined in a manner similar to that described in EXAMPLE 1 for the inverter circuit. Input A and three-terminal devices 310 and 320 correspond to a sub-circuit that behaves analogous to the inverter circuit. Similarly, Input B and three-terminal devices 330 and 340 correspond to a sub-circuit that behaves analogous to the inverter circuit. As in the discussion of the inverter circuit in EXAMPLE 1, we presume that the threshold and holding voltages of devices 310, 320, 330, and 340 are approximately the same and that the holding voltage is much lower than the ON cycle voltage of the clock signal. The collective response of the two sub-circuits dictates the output of the circuit. The signal produced at output terminal 395 corresponds to the signal appearing at output junction 390 and the signal appearing at output junction 390 is controlled by the configuration of the three-terminal devices in the circuit and whether the three-terminal devices are switched into their conductive state or not.

Three-terminal devices 320 and 340 are arranged in a parallel configuration between output junction 390 and ground. This means that if either device 320 or device 340 is switched to its conductive state, ground voltage plus the holding voltage results at output junction 390. Three-terminal devices 310 and 330, in contrast, are arranged in a series configuration between clock terminal 360 and output junction 390. This means that both devices 310 and 330 must be switched to their conductive states in order for the ON cycle clock voltage minus twice the holding voltage to result at output junction 390.

We begin by analyzing the operation of the circuit 300 when a high voltage signal is applied as Input A and a high voltage signal is applied as Input B. When the clock signal applied to clock terminal 360 is in its ON cycle and a high voltage input signal A is applied at input terminal 370, three-terminal device 320 switches from its resistive state to its conductive state. Three-terminal device 310, in contrast, does not switch and remains in its resistive state. Similarly, when a high voltage input signal B is applied at input terminal 380, three-terminal device 340 switches from its resistive state to its conductive state. Three-terminal device 330, in contrast, does not switch and remains in its resistive state. Since both device 320 and device 340 are switched to their conductive states, the pathway connecting output junction 390 and ground becomes conductive and ground voltage plus the holding voltage results at output junction 390. Since both device 310 and device 330 remain resistive, the voltage of the ON cycle clock signal drops primarily between clock terminal 360 and output junction 390. The net result is that a low voltage signal (having a magnitude of approximately the holding voltage above ground) appears at output junction 390 to provide a low voltage output signal at output terminal 395.

We continue by analyzing the operation of the circuit 300 when a high voltage signal is applied as Input A and a low voltage signal is applied as Input B. When the clock signal applied to clock terminal 360 is in its ON cycle and a high voltage input signal A is applied at input terminal 370, three-terminal device 320 switches from its resistive state to its conductive state. Three-terminal device 310, in contrast, does not switch and remains in its resistive state. When a low voltage input signal B is applied at input terminal 380, three-terminal device 330 switches from its resistive state to its conductive state. Three-terminal device 340, in contrast, does not switch and remains in its resistive state. Since device 320 is switched to its conductive state, a pathway connecting ground and output junction 390 becomes conductive and the ground voltage (plus the holding voltage of device 320) results at output junction 390. Since device 310 remains resistive, the voltage of the ON cycle clock signal drops primarily across device 310 (i.e. between clock terminal 460 and output junction 390). The net result is that a low voltage signal (having a magnitude approximately equal to the ground voltage plus the holding voltage) appears at output junction 390 to provide a low voltage output signal at output terminal 395.

We continue by analyzing the operation of the circuit 300 when a low voltage signal is applied as Input A and a high voltage signal is applied as Input B. When the clock signal applied to clock terminal 360 is in its ON cycle and a low voltage input signal A is applied at input terminal 370, three-terminal device 310 switches from its resistive state to its conductive state. Three-terminal device 320, in contrast, does not switch and remains in its resistive state. When a high voltage input signal B is applied at input terminal 380, three-terminal device 340 switches from its resistive state to its conductive state. Three-terminal device 330, in contrast, does not switch and remains in its resistive state. Since device 340 is switched to its conductive state, a pathway connecting ground and output junction 390 becomes conductive and the ground voltage (plus the holding voltage of device 340) results at output junction 390. Since device 330 remains resistive, the voltage of the ON cycle clock signal drops primarily across device 330 (i.e. between clock terminal 360 and output junction 390). The net result is that a low voltage signal (having a magnitude approximately equal to ground voltage plus the holding voltage) appears at output junction 390 to provide a low voltage output signal at output terminal 395.

We continue by analyzing the operation of the circuit 300 when a low voltage signal is applied as Input A and a low voltage signal is applied as Input B. When the clock signal applied to clock terminal 360 is in its ON cycle and a low voltage input signal A is applied at input terminal 370, three-terminal device 310 switches from its resistive state to its conductive state. Three-terminal device 320, in contrast, does not switch and remains in its resistive state. When a low voltage input signal B is applied at input terminal 380, three-terminal device 330 switches from its resistive state to its conductive state. Three-terminal device 340, in contrast, does not switch and remains in its resistive state. Since both devices 310 and 330 are switched to their conductive states, a pathway connecting clock terminal 360 and output junction 390 becomes conductive and the ON cycle clock voltage (less twice the holding voltage) results at output junction 390. Since devices 320 and 340 remain resistive, the voltage of the ON cycle clock signal drops primarily between output junction 390 and ground. The net result is that a high voltage signal (having a magnitude of approximately the ON cycle clock voltage less twice the holding voltage) appears at output junction 390 to provide a high voltage output signal at output terminal 395.

The relationship of the two inputs to the output summarized in the table above for the circuit described in this example corresponds to the NOR logical operation.

Example 4

In this example, a logic circuit that performs the AND operation is described. The circuit may be referred to herein as a AND circuit and may be achieved with a circuit that includes a series combination of a NAND gate and a NOT gate, where the NAND gate may be the circuit described in EXAMPLE 2 hereinabove and the NOT gate may be the circuit described in EXAMPLE 1 hereinabove. In the AND circuit, inputs A and B are provided to the input terminals of the NAND gate, are subsequently processed by the NAND gate to provide an output that is delivered to the input terminal of a NOT gate for processing to produce an ultimate output signal. The relationship between the ultimate output signal and the original input signals conforms to the AND logic operation.

Example 5

In this example, a logic circuit that performs the OR operation is described. The circuit may be referred to herein as an OR circuit and may be achieved with a circuit that includes a series combination of a NOR gate and a NOT gate, where the NOR gate may be the circuit described in EXAMPLE 3 hereinabove and the NOT gate may be the circuit described in EXAMPLE 1 hereinabove. In the OR circuit, inputs A and B are provided to the input terminals of the NOR gate, are subsequently processed by the NOR gate to provide an output that is delivered to the input terminal of a NOT gate for processing to produce an ultimate output signal. The relationship between the ultimate output signal and the original input signals conforms to the OR logic operation.

The disclosure and discussion set forth herein is illustrative and not intended to limit the practice of the instant invention. While there have been described what are believed to be the preferred embodiments of the instant invention, those skilled in the art will recognize that other and further changes and modifications may be made thereto without departing from the spirit of the invention, and it is intended to claim all such changes and modifications that fall within the full scope of the invention. It is the following claims, including all equivalents, in combination with the foregoing disclosure and knowledge commonly available to persons of skill in the art, which define the scope of the instant invention.

I claim:

1. A circuit comprising:
    a first three-terminal device, said first three-terminal device including a chalcogenide material, said chalcogenide material having a first threshold voltage, said chalcogenide material switching from a resistive state to a conductive state upon application of said first threshold voltage;
    a first terminal in electrical communication with said chalcogenide material;
    a second terminal in electrical communication with said chalcogenide material;
    a third terminal in electrical communication with said chalcogenide material;
    an input terminal for receiving an input signal;
    a clock terminal for receiving a clock signal; and
    an output terminal for providing an output signal, said input terminal delivering said input signal to said second terminal, said clock terminal delivering said clock signal to said first terminal, said output terminal being in electrical communication with said third terminal;
    wherein said clock signal has an ON cycle and an OFF cycle, the voltage delivered by said clock terminal to said first terminal during said ON cycle being greater than the voltage delivered by said clock terminal to said first terminal during said OFF cycle and the voltage delivered by said clock terminal to said first terminal during said ON cycle is less than said threshold voltage of said chalcogenide material between said first terminal and said third terminal when no signal input is present at said second terminal; and
    wherein said circuit performs a logic operation selected from the group consisting of AND, OR, NOT, NAND, NOR, XOR, and XNOR.

2. The circuit of claim 1, wherein said chalcogenide material comprises Te or Se.

3. The circuit of claim 2, wherein said chalcogenide material further comprises Ge.

4. The circuit of claim 2, wherein said chalcogenide material further comprises Si or As.

5. The circuit of claim 1, wherein the voltage of said input signal delivered to said second terminal of said first three-terminal device is sufficient to induce said chalcogenide material to switch from said resistive state to said conductive state between said first terminal and said third terminal of said first three-terminal device during said ON cycle of said clock signal.

6. The circuit of claim 5, wherein said circuit performs said logic operation during said ON cycle of said clock signal.

7. The circuit of claim 6, wherein said OFF cycle of said clock signal transforms said chalcogenide material from said conductive state to said resistive state.

8. A circuit comprising:
    a first three-terminal device, said first three-terminal device including a first chalcogenide material, said first chalcogenide material having a first threshold voltage, said first chalcogenide material switching from a resistive state to a conductive state upon application of said first threshold voltage;
    a first terminal in electrical communication with said first chalcogenide material;
    a second terminal in electrical communication with said first chalcogenide material;
    a third terminal in electrical communication with said first chalcogenide material;
    an input terminal for receiving an input signal;
    a clock terminal for receiving a clock signal; and
    an output terminal for providing an output signal, said input terminal delivering said input signal to said second terminal, said clock terminal delivering said clock signal to said first terminal, said output terminal being in electrical communication with said third terminal;
    a second three-terminal device interconnected between said input terminal and said output terminal, said second three-terminal device including a second chalcogenide material, said second chalcogenide material having a second threshold voltage, said second chalcogenide material switching from a resistive state to a conductive state upon application of said second threshold voltage;
    a fourth terminal in electrical communication with said second chalcogenide material;
    a fifth terminal in electrical communication with said second chalcogenide material; and
    a sixth terminal in electrical communication with said second chalcogenide material;
    wherein said first and second three-terminal devices are operatively connected to perform a logic function.

9. The circuit of claim 8, wherein said sixth terminal of said second three-terminal device is in electrical communication with said third terminal of said first three-terminal device.

10. The circuit of claim 8, wherein said input terminal further provides said input signal to said fifth terminal of said second three-terminal device.

11. The circuit of claim 8, wherein said circuit further comprises a second input terminal, said second input terminal providing a second input signal to said fifth terminal of said second three-terminal device.

12. A circuit comprising:
a first three-terminal device, said first three-terminal device including a first chalcogenide switching material, a first terminal in electrical communication with said first chalcogenide switching material, a second terminal in electrical communication with said first chalcogenide switching material, and a third terminal in electrical communication with said first chalcogenide switching material;
a second three-terminal device operatively connected to said first three-terminal device, said second three-terminal device including a second chalcogenide switching material, a fourth terminal in electrical communication with said second chalcogenide switching material, a fifth terminal in electrical communication with said second chalcogenide switching material, and a sixth terminal in electrical communication with said second chalcogenide switching material;
an input terminal for receiving an input signal;
a clock terminal for receiving a clock signal; and
an output terminal for providing an output signal, said input terminal delivering said input signal to said second terminal of said first three-terminal device, said clock terminal delivering said clock signal to said first terminal of said first three-terminal device, said output terminal being in electrical communication with said third terminal of said first three-terminal device;
wherein said clock signal has an ON cycle and an OFF cycle, the voltage delivered by said clock terminal to said first terminal during said ON cycle being greater than the voltage delivered by said clock terminal to said first terminal during said OFF cycle and the voltage delivered by said clock terminal to said first terminal during said ON cycle is less than said threshold voltage of said first chalcogenide material between said first terminal and said third terminal when no signal input is present at said second terminal; and
wherein said circuit performs a logic operation.

13. The circuit of claim 12, wherein said first and second three-terminal devices are connected in series.

14. The circuit of claim 12, wherein said first and second three-terminal devices are connected in parallel.

15. The circuit of claim 12, wherein the voltage of said input signal delivered to said second terminal of said first three-terminal device is sufficient to induce said first chalcogenide material to switch from said resistive state to said conductive state between said first terminal and said third terminal of said first three-terminal device during said ON cycle of said clock signal.

16. A circuit comprising:
a first three-terminal device, said first three-terminal device including a first chalcogenide material, said first chalcogenide material having a first threshold voltage, said first chalcogenide material switching from a resistive state to a conductive state upon application of said first threshold voltage;
a first terminal in contact with said first chalcogenide material;
a second terminal in contact with said first chalcogenide material;
a third terminal in contact with said first chalcogenide material; and
a second three-terminal device interconnected to the first three-terminal device, said second three-terminal device including a second chalcogenide material;
wherein said circuit performs a logic operation, said first chalcogenide material not undergoing a phase transition from an amorphous phase to a crystalline phase during said logic operation.

17. The circuit of claim 12, wherein said circuit performs a logic operation selected from the group consisting of AND, OR, NOT, NAND, NOR, XOR, and XNOR.

18. The circuit of claim 16, wherein said first chalcogenide material comprises Te or Se.

19. The circuit of claim 18, wherein said first chalcogenide material further comprises Ge.

20. The circuit of claim 18, wherein said first chalcogenide material further comprises Si or As.

21. The circuit of claim 16, wherein said circuit further comprises an input terminal for receiving an input signal, a clock terminal for receiving a clock signal and an output terminal for providing an output signal, said input terminal delivering said input signal to said second terminal of said first three-terminal device, said clock terminal delivering said clock signal to said first terminal of said first three-terminal device, said output terminal being in electrical communication with said third terminal of said first three-terminal device.

22. The circuit of claim 21, wherein said clock signal has an ON cycle and an OFF cycle, the voltage delivered by said clock terminal to said first terminal of said first three-terminal device during said ON cycle being greater than the voltage delivered by said clock terminal to said first terminal of said three-terminal device during said OFF cycle.

23. The circuit of claim 22, wherein the voltage delivered by said clock terminal to said first terminal of said three-terminal device during said ON cycle is less than said threshold voltage of said first chalcogenide material between said first terminal and said third terminal of said first three-terminal device when no signal input is present at the second terminal.

24. The circuit of claim 23, wherein the voltage of said input signal delivered to said second terminal of said first three-terminal device is sufficient to induce said first chalcogenide material to switch from said resistive state to said conductive state between said first terminal and said third terminal of said first three-terminal device during said ON cycle of said clock signal.

25. The circuit of claim 24, wherein said circuit performs said logic operation during said ON cycle of said clock signal.

26. The circuit of claim 25, wherein said OFF cycle of said clock signal transforms said first chalcogenide material from said conductive state to said resistive state.

27. The circuit of claim 21, wherein said circuit further comprises said second three-terminal device interconnected between said input terminal and said output terminal, said second chalcogenide material having a second threshold voltage, said second chalcogenide material switching from a resistive state to a conductive state upon application of said second threshold voltage;
a fourth terminal in electrical communication with said second chalcogenide material;
a fifth terminal in electrical communication with said second chalcogenide material; and
a sixth terminal in electrical communication with said second chalcogenide material.

28. The circuit of claim 27, wherein said sixth terminal of said second three-terminal device is in electrical communication with said third terminal of said first three-terminal device.

29. The circuit of claim 27, wherein said input terminal further provides said input signal to said fifth terminal of said second three-terminal device.

30. The circuit of claim 27, wherein said circuit further comprises a second input terminal, said second input terminal providing a second input signal to said fifth terminal of said second three-terminal device.

31. A circuit comprising:
- a first three-terminal device, said first three-terminal device including a first chalcogenide switching material, a first terminal in direct contact with said first chalcogenide switching material, a second terminal in direct contact with said first chalcogenide switching material, and a third terminal in direct contact with said first chalcogenide switching material; and
- a second three-terminal device, said second three-terminal device including a second chalcogenide switching material, a fourth terminal in electrical communication with said second chalcogenide switching material, a fifth terminal in electrical communication with said second chalcogenide switching material, and a sixth terminal in electrical communication with said second chalcogenide switching material;
- wherein said first and second three-terminal devices are operatively connected to perform a logic operation.

32. The circuit of claim 31, wherein said first and second three-terminal devices are connected in series.

33. The circuit of claim 31, wherein said first and second three-terminal devices are connected in parallel.

34. The circuit of claim 31, wherein said circuit further comprises an input terminal for receiving an input signal, a clock terminal for receiving a clock signal and an output terminal for providing an output signal, said input terminal delivering said input signal to said second terminal of said first three-terminal device, said clock terminal delivering said clock signal to said first terminal of said first three-terminal device, said output terminal being in electrical communication with said third terminal of said first three-terminal device.

35. The circuit of claim 34, wherein said clock signal has an ON cycle and an OFF cycle, the voltage delivered by said clock terminal to said first terminal of said first three-terminal device during said ON cycle being greater than the voltage delivered by said clock terminal to said first terminal of said first three-terminal device during said OFF cycle.

36. The circuit of claim 35, wherein the voltage delivered by said clock terminal to said first terminal of said first three-terminal device during said ON cycle is less than said threshold voltage of said first chalcogenide material between said first terminal and said third terminal of said first three-terminal device when no input signal is provided to the second terminal of said first three-terminal device.

37. The circuit of claim 36, wherein the voltage of said input signal delivered to said second terminal of said first three-terminal device is sufficient to induce said first chalcogenide material to switch from said resistive state to said conductive state between said first terminal and said third terminal of said first three-terminal device during said ON cycle of said clock signal.

38. The circuit of claim 31, wherein said fourth, fifth and sixth terminals are in direct contact with said second chalcogenide switching material.

* * * * *